United States Patent [19]

Huizer et al.

[11] Patent Number: 5,459,766
[45] Date of Patent: Oct. 17, 1995

[54] DIGITAL PHASE-LOCKED LOOP

[75] Inventors: Cornelis M. Huizer, Veldhoven; Laurens Doornhein, Eindhoven, both of Netherlands

[73] Assignee: U.S. Philips Corporation, New York, N.Y.

[21] Appl. No.: 222,134

[22] Filed: Apr. 1, 1994

[30] Foreign Application Priority Data

Apr. 5, 1993 [EP] European Pat. Off. .............. 93200986
Aug. 24, 1993 [EP] European Pat. Off. .............. 93202489

[51] Int. Cl.$^6$ ..................................................... H03D 3/24
[52] U.S. Cl. ........................................... 375/376; 375/373
[58] Field of Search .................................. 375/120, 371, 375/373; 331/17, 18, 25, 34, 2

[56] References Cited

U.S. PATENT DOCUMENTS 4,802,009  1/1989  Hartmeier ............................ 358/158
5,337,335  8/1994  Cloetens et al. ..................... 375/120

FOREIGN PATENT DOCUMENTS 0299724  1/1989  European Pat. Off. .

OTHER PUBLICATIONS

"Line–locked Digital Colour Decoding", by T. Nillesen, ACTA Electronica 27, 1–2, 1985, pp. 101–107.

*Primary Examiner*—Stephen Chin
*Assistant Examiner*—Hueng Luu
*Attorney, Agent, or Firm*—Edward W. Goodman

[57] ABSTRACT

An integrated circuit comprises a time-discrete oscillator which generates numerical and time-discrete phase values of an oscillator signal. The circuit also comprises a time-continuous oscillator which generates a time-continuous oscillation signal. The circuit comprises a phasemeter which is coupled to the time-continuous oscillator in order to sample phase values of the time-continuous signal. The difference between the generated phase values and the sampled phase values is measured in a comparator circuit. This difference is utilized in a phase-locked loop in order to readjust the frequency of the time-continuous oscillator, so that the time-continuous oscillation is latched to the time-discrete oscillation. The phase comparison can thus be executed in a substantially time-discrete manner. As a result, the operational reproducibility of the circuit is very high. Because phase comparison is not restricted to a single, fixed phase point during the oscillation period, the phase locking exhibits hardly any jitter.

10 Claims, 11 Drawing Sheets

DIGITAL PHASE-LOCKED LOOP

The invention relates to an integrated circuit, comprising
a clock circuit for generating a clock signal,
a time-discrete oscillator for generating a time-discrete oscillation signal which contains an associated time-discrete signal value for each period of the clock signal,
a time-continuous oscillator for generating a time-continuous oscillation signal,
a phase-locked loop for measuring a phase difference between the time-discrete oscillation signal and the time-continuous oscillation signal, operative to readjust a frequency of the time-continuous oscillator under the control of the phase difference. An integrated circuit of this kind is known from European Patent Application No. 0 299 724, corresponding to U.S. Pat. No. 4,802,009.

The time-discrete oscillator in the known circuit comprises a cyclic counter. This counter comprises a register with a limited number of bits which represent a count during operation. The counter increments the count by a fixed amount in each clock cycle. Because a maximum count is imposed by the number of bits in the counter, this is a modulo-addition. When the counter exceeds the maximum representable count by a given amount during an addition, the counter will start the next addition as from that amount. The time-discrete oscillator comprises a flipflop whose state changes whenever the maximum count is exceeded in this manner. The output signal of the flipflop serves as the time-discrete oscillation signal. The logic level of this signal thus changes in the clock cycles in which the maximum count is exceeded.

The time-discrete oscillator is an all-digital oscillator. The binary signal is reproducible within the precision of the clock circuit. The instants at which the level of the binary signal changes always coincide with the end of a clock cycle. The mean period of the binary signal, i.e. twice the mean period of time elapsing between successive level changes, follows from the ratio of the amount whereby the count is incremented to the maximum count of the counter.

When the mean period does not equal an integer number of periods between clock cycles, the number of clock cycles between individual level changes will suffer from quantization noise or "jitter". In the course of time the period elapsing between successive level changes of the binary signal will not always comprise the same number of clock cycles, but will occasionally comprise one cycle more or less.

In order to eliminate this effect, in accordance with the prior art the binary signal is applied to an adjustable delay circuit. The delay of this circuit is adjusted on the basis of the count: as the maximum count is exceeded by a larger amount during an addition, the delay imparted to the binary signal is proportionally less.

The instant at which the level of the binary signal changes is thus shifted in phase relative to the clock signals. The period duration between successive level changes of the binary signal no longer amounts to an integer number of clock cycles. The period duration between successive instants at which the maximum count is exceeded can thus in principle be made equal to its mean value, so that jitter no longer occurs.

However, this necessitates a delay that can be very accurately adjusted. This delay must be adjustable to a series of delay times $T/N$ which successively deviate exactly a fraction $T/N$ (N integer) from the mean period $T$ of the binary signal. In practice inaccuracies are inevitable in these delay times, so that jitter remains.

The known circuit utilizes a chain of inverters for the delay. This chain produces delay values which are independent of the mean period of the binary signal. Therefore, the delay values cannot be accurately adjusted in all circumstances if the mean period itself varies during operation.

For further reduction of jitter, EP 0 299 724 proposes the use of a time-discontinuous oscillator whose phase is locked to the time-discrete oscillator. Therein, the period of time elapsing between the instant of level change of the oscillation signal of the time-continuous oscillator and of the delayed binary signal is measured. This period of time represents the phase difference between the oscillation signals of the time-discrete oscillator and the time-continuous oscillator. The phase difference is filtered by means of a low-pass filter, after which it is used to readjust the time-continuous oscillator so that its phase is locked to the delayed binary signal. Filtering equalizes the effects of the jitter on the time-continuous oscillator. As the cut-off frequency of the low-pass filter is lower, the jitter will be less. When the mean period duration of the time-discrete oscillator is readjusted, the response of the time-continuous oscillator to the readjustment, however, will then be slower.

It is inter alia an object of the invention to reduce jitter caused by readjustment of the period of the time-discrete oscillator.

It is inter alia a further object of the invention to accelerate the response of the time-continuous oscillator without giving rise to more jitter.

The integrated circuit in accordance with the invention is characterized in that the phase-locked loop comprises
a phasemeter which is coupled to the time-continuous oscillator and which is operative to measure a sampled phase value of the time-continuous oscillation signal for each period of the clock signal, and
a comparator circuit for determining the phase difference for each period by comparing the sampled phase value in said period with the time-discrete signal value associated with the relevant period.

Thus, effectively first the phase difference of the time-continuous signal and the clock signals is measured. Subsequently, the comparator circuit determines the phase difference of the time-continuous oscillation signal and the time-discrete signal. To this end use is made of, for example the counts in the time-discrete oscillator which describe the phase of the time-discrete oscillator relative to the clock signals. The second step, i.e. determination of the phase difference relative to the time-discrete signal, is digital and time-discrete: this determination does not require time-continuous signals. Therefore, this step can be executed in a highly reproducible manner.

Furthermore, the phase comparison instants are no longer limited to the instants at which the time-discrete oscillator exceeds the maximum count. In each clock cycle an independent phase comparison is possible, as opposed to the state of the art where phase comparison is possible only during clock cycles in which the maximum count is exceeded. Thus, in accordance with the invention a number of comparisons can be averaged over a time interval in which only one comparison is available according to the state of the art. As a result, the time-continuous oscillator can respond faster without giving rise to additional jitter.

An embodiment of the integrated circuit in accordance with the invention is characterized in that it comprises a delay chain with an input for receiving a basic signal of the time-continuous oscillation signal and two or more taps for tapping respective, mutually delayed signals, which taps are coupled to the phasemeter for sampling, the phasemeter comprising decoding means for decoding the sampled phase value from the mutually delayed signals. The signal of the time-continuous oscillator will traverse the delay chain. A distinct point in the signal, such as a level change, will then appear successively on successive taps of the delay chain. It can be detected to which tap such a distinct point has progressed. This is a measure of the transit time elapsed since the instant of arrival of the distinct point at the input, measured in units of delay times of the delay chain. The transit time is a measure of the phase.

The time-continuous oscillation can be generated by retrocoupling at least one of the taps to the input of the delay chain. The frequency of the time-continuous oscillator can be readjusted by adjusting a delay time of the delay chain. Thus, the measurement units of the transit time are readjusted in proportion to the period duration of the time-continuous oscillator. As a result, the number of taps passed by the distinct point is a pure measure of the phase, independent of the readjustment of the frequency of the time-continuous oscillator.

A further embodiment of an integrated circuit in accordance with the invention is characterized in that at least one of the taps is retrocoupled to the input of the delay chain in order to generate the basic signal, and in that the phase-locked loop is operative to readjust the delay time of a part of the delay chain which is dependent on the measured phase difference. The degree of readjustment of the frequency is thus adjustable. Preferably, the parts of the delay chain which are readjusted are distributed as uniformly as possible over the chain, so that the delay time between successive taps is alternately adjusted and not readjusted as well as possible. Readjustment of the delay time is then uniformly distributed over the period of the time-continuous oscillation.

A further embodiment of an integrated circuit in accordance with the invention, in which at least one of the taps is retrocoupled to the input of the delay chain in order to generate the basic signal, is characterized in that the phase-locked loop is operative to readjust the delay time of the delay chain during a part of each period of the basic signal, which part is dependent on the measured phase difference. The delay time can thus be readjusted in dependence on the phase difference, for example during a whole, a half or a quarter period of the time-continuous oscillation signal. A digitally adjustable delay time is thus simply obtained.

For the delay chain use is preferably be made of a chain of binary delay elements such as inverters. When use is made of binary delay elements, the circuit can be substantially all-digital. This enables implementation of the circuit by means of a design and manufacturing process for digital integrated circuits. Circuit elements in a digital integrated circuit offer the advantage that they are comparatively insensitive to a spread in the parameters of the manufacturing process. Moreover, fast and thorough testing of the circuit elements is possible, for example by way of a boundary scan test as described in IEEE test standard P 1149.1.

A further embodiment of the integrated circuit in accordance with the invention is characterized in that the delay chain comprises a chain of first binary delay elements whereto second binary delay elements can be connected in parallel in dependence on the phase difference in order to readjust the frequency by variation of a charging or discharging speed of the outputs of the respective first binary delay elements. As a result of the use of the second binary delay elements, the circuit is also binary for the readjustment of the frequency of the time-continuous oscillator and the circuit elements used for this purpose can thus be suitably tested. For the binary delay elements use can be made of, for example standard inverters.

An embodiment of the integrated circuit in accordance with the invention is characterized in that the time-continuous oscillator comprises a divider for generating the time-continuous oscillation signal by frequency division of the basic signal, the divider comprising a counting output which is coupled to the decoding means which are operative to determine the phase value from the mutually delayed signals and from a count of a number of periods of the basic signal having passed since a beginning of a period of the time-continuous oscillation signal. The time-continuous oscillation signal thus has a frequency which amounts to a fraction of the frequency of the basic signal. The combination of the counting and the measurement of the progress of the basic signal enables high-resolution measurement of the phase value.

An embodiment of the integrated circuit in accordance with the invention is characterized in that the phasemeter comprises a latch circuit, inputs of which are connected to the taps and whose outputs are connected to the decoding means, the clock circuit therein being coupled to a clock input of the latch circuit in order to sample the mutually delayed signals. Sampling of the phase value is thus implemented by means of a binary latch operating in synchronism with the clock signals.

The taps of the decoding means are preferably coupled to address inputs of a read-only memory, a data output of which serves to supply the phase values, respective locations of said memory containing respective phase values associated with respective configurations of signals on the taps. The measurement of the phase values can thus be simply implemented by means of a binary and hence suitably testable circuit. When the contents of the ROM are suitably chosen, phase values can be applied to the comparator circuit in any desired representation.

The comparator circuit preferably comprises a difference-determining circuit for determining a numerical difference between the generated phase value and the sampled phase value, the phase-locked loop being operative to readjust the frequency in dependence on a sign of the difference. The comparison can thus be simply implemented in binary form.

A further embodiment is characterized in that it comprises a further phase-locked loop for readjusting a frequency of the time-discrete oscillator in dependence on a phase difference between the time-continuous oscillation signal and an external signal. The further phase-locked loop can operate in a fully time-discrete and numerical manner, because it controls a time-discrete oscillation circuit. Therefore, this phase-locked loop is insensitive to parameter spreads in the integrated circuit. This enables the use of, for example accurately defined loop filters or the freezing of the loop without incurring the risk of drift in the frequency of the time-discrete oscillator.

The invention and the advantages mentioned will be described in detail hereinafter with reference to drawings.

Figure 1:
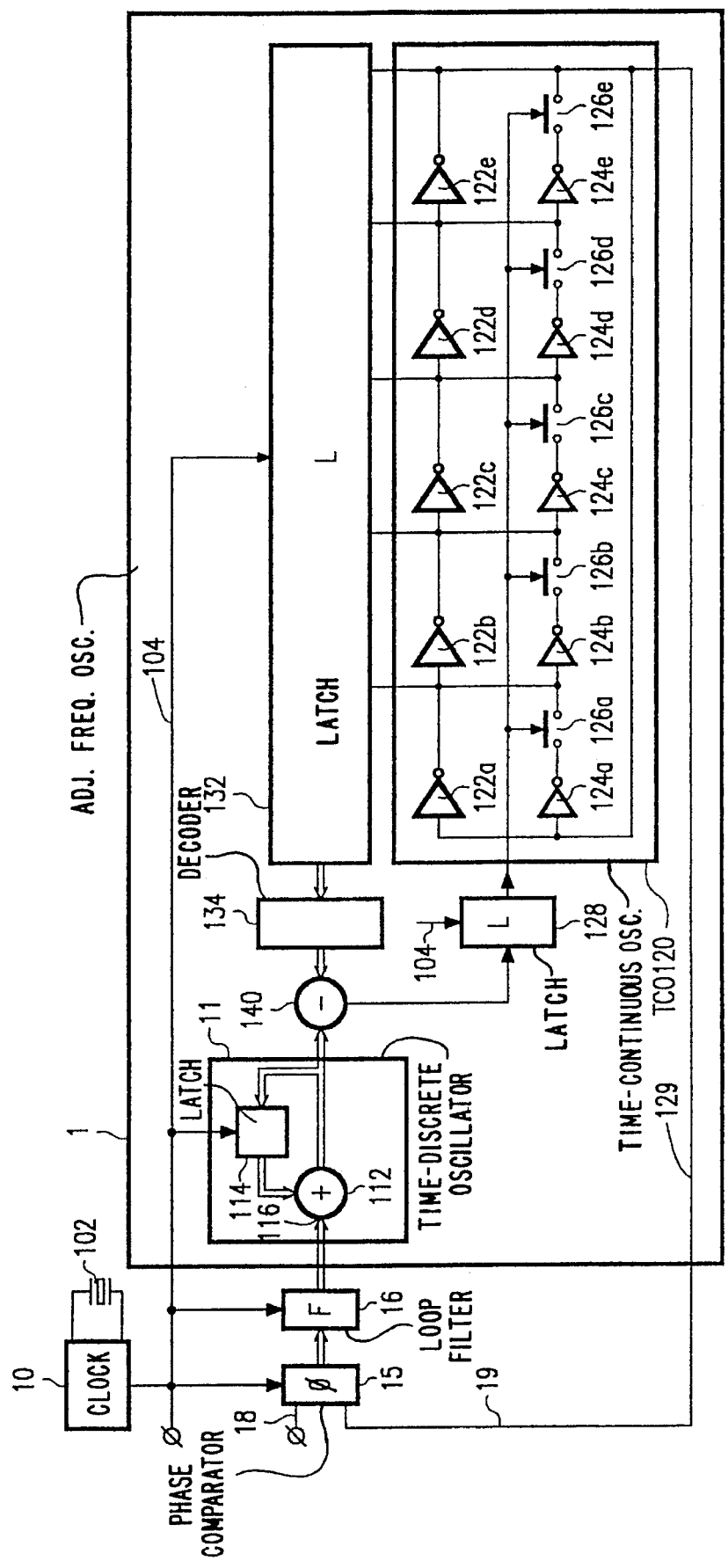
FIG. 1 shows a circuit with phase control in accordance with the invention.

FIG. 1 shows a circuit with phase control (PLL). This circuit comprises an input 18 for an external signal, for example a horizontal synchronization signal in a television receiver. The input 18 is connected to a phase comparator 15. The phase comparator 15 is coupled to a loop filter 16. The loop filter is coupled to the frequency control input 116 of an adjustable-frequency oscillator 1 (conventionally referred to as VCO: "Voltage Controlled Oscillator", even though the present invention preferably does not involve control by an analog voltage). The output 129 of the VCO 1 is coupled to an input 19 of the phase comparator 15 which also receives the external signal. The circuit comprises a clock 10 (shown to include a crystal 102 in order to indicate that this clock is very accurate; in practice use can also be made of an external clock). The clock 10 feeds a clock line 104.

The VCO 1 comprises a time-continuous oscillator 120 and a time-discrete oscillator 11. The time-discrete oscillator 11 comprises a digital adder 112 and a latch 114. The adder 112 comprises a first input 116 for a frequency control signal. The output of the latch 114 is coupled to a second input of the adder 112. The output of the adder 112 is coupled to the data input of the latch 114. The clock line 104 is coupled to a clock input of the latch 114.

The time-continuous oscillator 120 comprises a series connection of a number of inverting delay elements 122a, 122b, 122c, 122d, 122e. The number of five delay elements 122a, b,c,d,e is chosen by way of example. Evidently, any odd number can be used. The output also constitutes the output 129 of the time-continuous oscillator and is retrocoupled to the input of the delay element 122a at the beginning of the series connection. In parallel with the delay elements 122a, 122b, 122c, 122d, 122e there are included further delay elements 124a, 124b, 124c, 124d, 124e which are coupled to the inputs of the delay elements 122a, b,c,d,e via respective switches 126a, 126b, 126c, 126d, 126e. The outputs of the delay elements 122a, 122b, 122c, 122d, 122e are coupled to a data input of a multibit latch circuit 132. The output of the latch circuit 132 is coupled to a decoder 134. The output of the decoder 134 is coupled to a first input of a comparator 140. The second input of the comparator 140 is coupled to the output of the adder 112 in the time-discrete oscillator 11. The output of the comparator 140 is coupled to a data input of a latch 128 whose output is connected so as to control the switches 126a, 126b, 126c, 126d, 126e in the time-continuous oscillator 120.

The clock line 104 is connected to clock inputs of the latch 132 and the latch 128.

The phase comparator 15, the loop filter 16 and the VCO 1 constitute a first, time-discrete phase-locked loop during operation. This loop is time-discrete in a sense that the components take a signal sample each time in response to the clock signal, which sample is processed and substantially remains the same until the next clock signal. For the operation of this first phase-locked loop, notably for the operation of the phase comparator 15 and the loop filter, reference is made to an article by A. H. H. J. Nillesen: "Line-locked digital colour decoding", published in ACTA ELECTRONICA, Vol. 27, 1–2, 1985, pp. 101–107. This loop is suitable notably for recovering a horizontal sync signal from a television signal when the sync signal is presented to the input 18. In the context of the present invention it suffices to note that for suitable operation of the first phase-locked loop the signal on the output 129 of the VCO 1 should exhibit as few as possible time quantization effects due to the sampling by the clock, i.e. as little jitter as possible which is experienced as noise. On the output of the time-discrete oscillator the recovered sync signal is available as a time-discrete digital signal for further time-discrete digital signal processing.

The time-continuous oscillator 120 and the time-discrete oscillator 11 are locked to one another in a second phase-locked loop. The time-discrete oscillator 11 is time-discrete in a sense that its signal value is refreshed exclusively at sampling instants. These sampling instants are signalled by the clock 10 which drives the latch 114 to latch a new signal value. This signal value is digital and constitutes the count of the adder 112.

The time-discrete oscillator 11 operates as a modulo counter whose counting signal $s_n$ is incremented by an amount $d_n$ at every sampling instant "n" and, incidentally (when the counting signal exceeds a limit), decremented again by an amount m:

$$s_{n+1}=(s_n+d_n) \text{ modulo } m$$

This decrementation is realised in that the adder 112 has only a limited number of bits and in that it ignores overflow.

The temporal resolution of the time-discrete oscillator 11 is limited per definition: the count is refreshed only at sampling instants. Conceptually speaking, the counts can be interpreted as being time-discrete samples of a sawtooth signal.

The time-continuous oscillator 120 is a ring oscillator which oscillates during operation with an oscillation period which corresponds to the time required to traverse the chain of delay elements 122a, 122b, 122c, 122d, 122e. The phase of the oscillation is derived by measuring how far the signal transition has already progressed through the chain of delay elements 122a, 122b, 122c, 122d, 122e. In order to determine this phase at a sampling instant, the signals on the outputs of the delay elements 122a, 122b, 122c, 122d, 122e are latched in the latch circuit 132 under the control of the clock 10.

The phase is decoded from the latched signals by means of the decoder 134. The decoder 134 may be constructed, for example as a ROM which stores an associated phase value for all combinations of signals. The below Table shows an example of the contents of such a ROM. The left-hand column contains the addresses, that is to say the signals latched in the latch circuit 132 from the outputs of the delay elements 122a, 122b, 122c, 122d, 122e under the control of the clock 10. The right-hand column shows the contents of the ROM at these addresses, i.e. the associated phase values, in tenth parts of a full period (360 degrees).

| | |
|---|---|
| 01010 | 0 |
| 11010 | 1 |
| 10010 | 2 |
| 10110 | 3 |
| 10100 | 4 |
| 10101 | 5 |
| 00101 | 6 |
| 01101 | 7 |
| 01001 | 8 |
| 01011 | 9 |

This Table holds for the oscillator 120 as shown in FIG. 1. Every combination 00, 11 of a successive 0 or 1 as the signal of the delay elements is unstable, because it is not compatible with the inverting logic function. Therefore, the signals of successive rows are obtained by replacing each time 00 or 11 by 01 and 10, respectively.

Instead of the oscillator 120 use can be made of an oscillator comprising a larger or smaller odd number of inverters 122a, b,c,d,e. The Table should then be adapted accordingly. Instead of constructing the decoder 134 as a ROM, it can also be constructed as a logic gate circuit having the logic function described in the Table, for example by means of a PLD.

The counts of the time-discrete oscillator 11 are characteristic of the phase of the time-discrete oscillator 11. The comparator 140 compares the count with the decoded phase of the time-continuous oscillator at every sampling instant. The result indicates which of the oscillators (the time-discrete oscillator 11 or the time-continuous oscillator 120) is leading. This result is used to make a decision as regards the position of the switches 126a, 126b, 126c, 126d, 126e.

The junctions at the outputs of the delay elements 122a, 122b, 122c, 122d, 122e have a respective capacitance to ground. This may be a parasitic capacitance or an explicitly introduced capacitance; for the sake of simplicity, these capacitances are not shown. Each of the delay elements 122a, 122b, 122c, 122d, 122e comprises an output stage in order to charge or discharge the capacitance. This will require some time and this time corresponds to the delay time of the delay elements. Each of the further delay elements 124a, 124b, 124c, 124d, 124e also comprises an output stage. When the switches 126a, 126b, 126c, 126d, 126e are short-circuited, the further delay elements 124a, 124b, 124c, 124d, 124e will assist the delay elements 122a, 122b, 122c, 122d, 122e in charging or discharging the capacitances, thus reducing the delay time.

As soon as the comparator 140 reveals that the phase of the time-continuous oscillator 120 lags that of the time-discrete oscillator 11, the switches 126a, 126b, 126c, 126d, 126e will be closed; the delay times in the time-continuous oscillator are thus reduced. The phase of the time-continuous oscillator 120 will then catch up with that of the time-discrete oscillator 11. As soon as the time-continuous oscillator 120 starts to lead, the switches 126a, 126b, 126c, 126d, 126e are opened again, after which the time-discrete oscillator 11 will catch up with the time-continuous oscillator 120 again. The two oscillators are thus synchronized.

The time-continuous oscillator is thus readjusted at a number of sampling instants within a period. Fast and accurate control is thus achieved. All control circuits are digital and clocked so that they are comparatively independent of process spreads and simply testable.

Various alternative versions of this circuit are feasible without departing from the scope of the invention. For example, the time-continuous oscillator 120 can also be readjusted by readjusting the power supply for the delay elements 122a, 122b, 122c, 122d, 122e, because the delay time is thus also influenced. Such readjustment, however, utilizes partly analog circuit properties and hence is more sensitive to parameter spreads than the circuit shown in FIG. 1.

Figure 2:
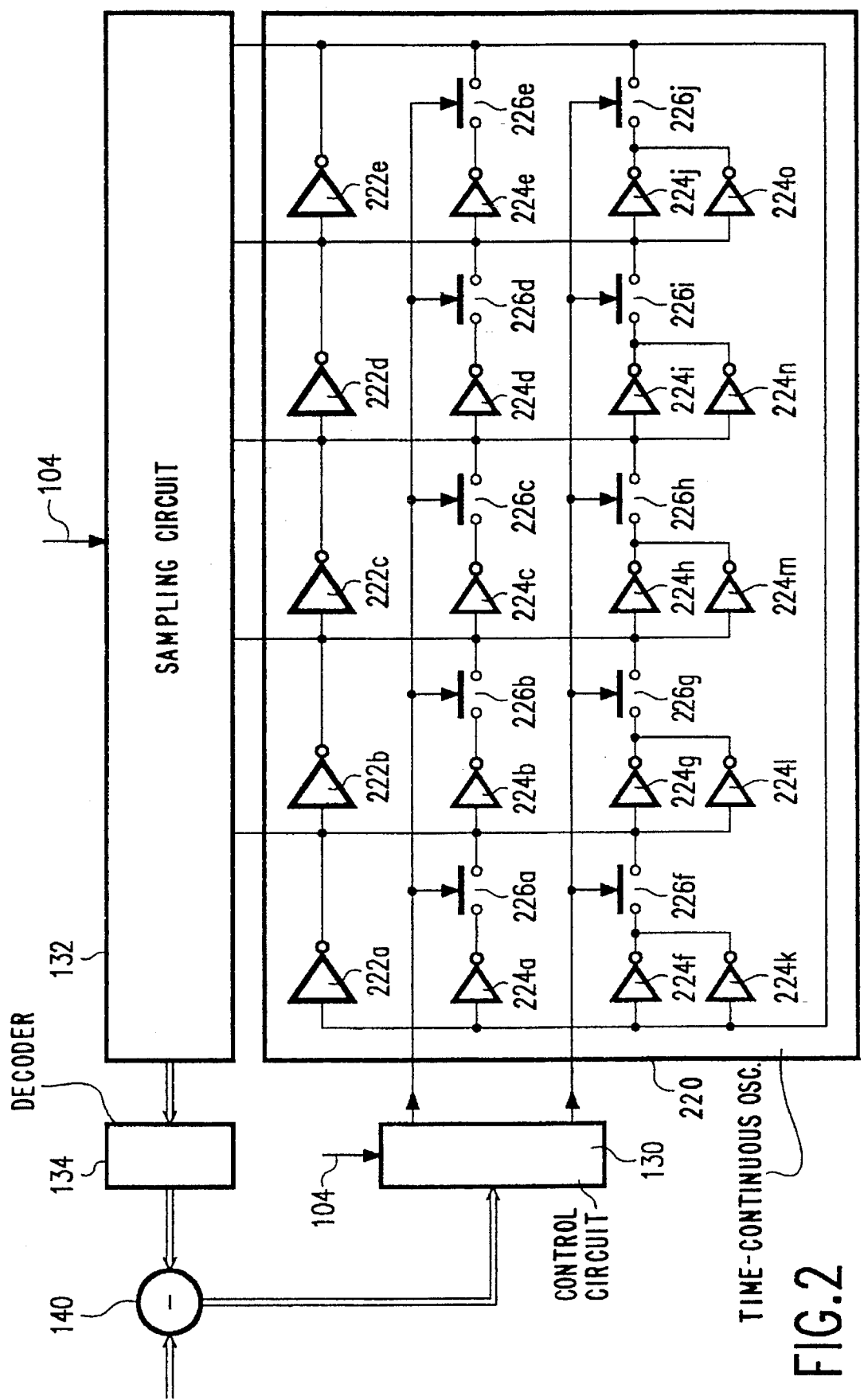
FIG. 2 shows a further circuit with phase control in accordance with the invention.

FIG. 2 shows a further alternative. In addition to the components already shown in FIG. 1, FIG. 2 comprises, included in the time-continuous oscillator circuit 220 and therein in parallel with each of the delay elements 222a, 222b, 222c, 222d, 222e, a plurality (three in the Figure by way of example) of further delay elements 224a, 224b, 224c, 224d, 224e, 224f, 224g, 224h, 224i, 224j. A first group 224a, 224b, 224c, 224d, 224e of these further delay elements is connected, via a respective switch 226a, 226b, 226c, 226d, 226e, to the output of a delay element 222a, 222b, 222c, 222d, 222e; a second group 224e, 224f, 224g, 224h, 224i, 224j of these further delay elements is connected pairwise, via a further respective switch 226e, 226f, 226g, 226h, 226i, 226j, to the output of a delay element 222a, 222b, 222c, 222d.

The delay can thus be adjusted in steps by closing either no group, one group or several groups of the switches 226a, 226b, 226c, 226d, 226e, 226f, 226g, 226h, 226i, 226j. The choice, and the number, of groups of switches to be closed is determined on the basis of the magnitude of the phase difference measured by the comparator 140. The time-continuous oscillator will be readjusted more as this difference is greater.

The further delay elements 224a, 224b, 224c, 224d, 224e, 224f, 224g, 224h, 224i, 224j may have an identical construction. Alternatively, use can be made of further delay elements 224a, 224b, 224c, 224d, 224e, 224f, 224g, 224h, 224i, 224j with a mutually different charging intensity. A group of further delay elements (224a–e) having a charging intensity which is each time a power ½ lower is then added to each delay element 222a.

Figure 3:
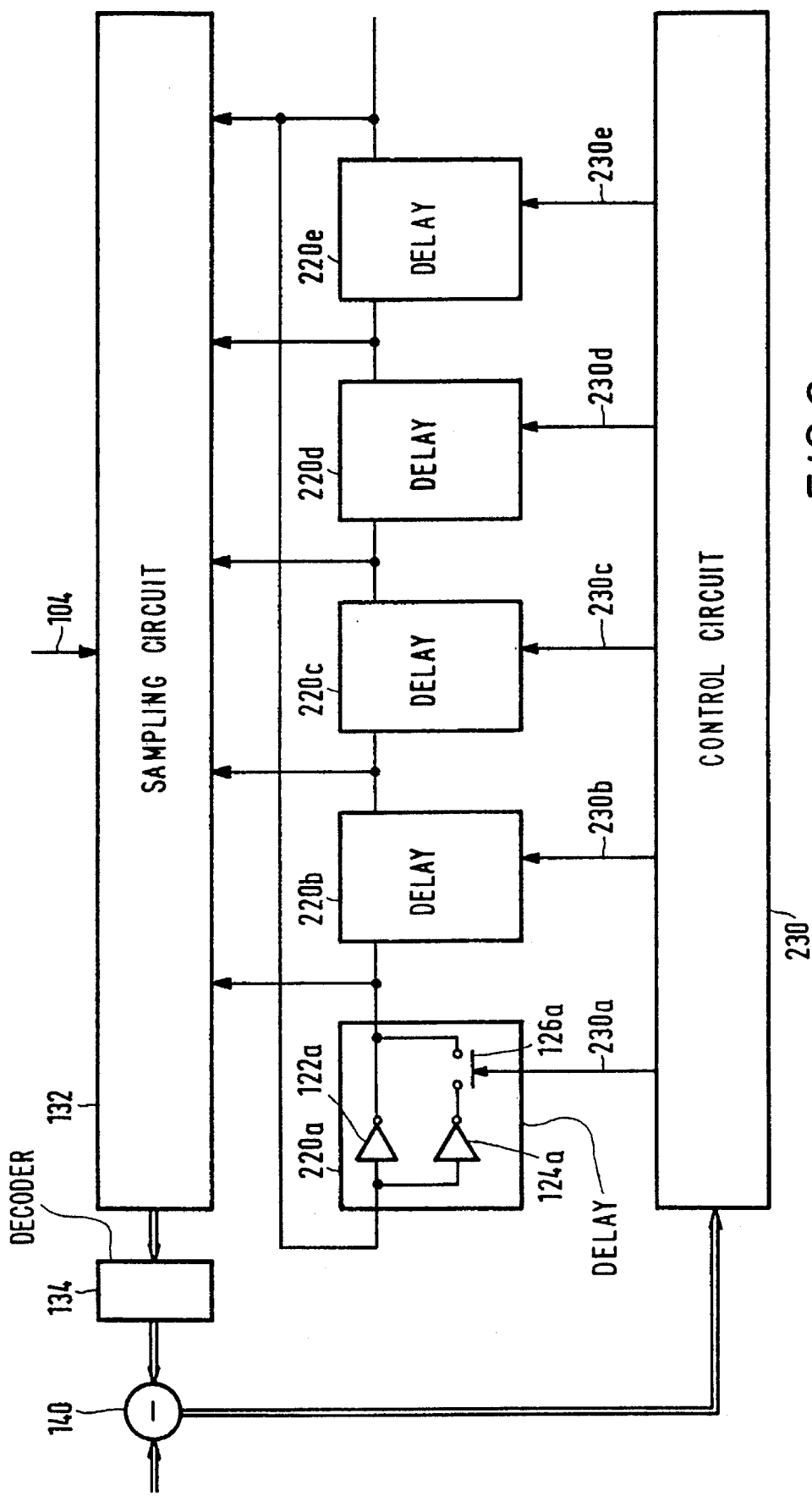
FIG. 3 shows another circuit with phase control in accordance with the invention.

FIG. 3 shows a further circuit with phase control in accordance with the invention. Elements corresponding to the elements shown in the FIGS. 1 and 2 are denoted by corresponding reference numerals. The delay elements are shown as blocks 220a,b,c,d,e, which symbolize, for example the parallel switchable inverters 122a, 124a with the associated switch 126a. The output 140a of the comparator 140 is coupled to a control circuit 230 in FIG. 3. The outputs 230a,b,c,d,e of the control circuit 230 are coupled to the control inputs of the respective delay elements 220a,b,c,d,e.

During operation, the control circuit readjusts the delay time of the various delay elements 220a,b,c,d,e independently of one another. The number of delay elements readjusted is proportional to the signal value on the output of the comparator 140, i.e. to the measured phase difference. The following Table shows an example of the relationship between the measured phase difference (in tenths of a complete period) and the readjustment.

| phase | a | b | c | d | e |
|---|---|---|---|---|---|
| 0 | on | off | on | off | on |
| 1 | off | off | on | off | on |
| 2 | off | off | off | off | on |
| 3 | off | off | off | off | off |
| 4 | off | off | off | off | off |

-continued

| phase | a | b | c | d | e |
|---|---|---|---|---|---|
| 5 | on | on | on | on | on |
| 6 | on | on | on | on | on |
| 7 | on | on | on | on | on |
| 8 | on | on | on | on | on |
| 9 | on | off | on | on | on |

The first column contains the phase difference produced by the comparator 140. Each subsequent column holds for a respective delay element 220a,b,c,d,e, and indicates whether the delay time of the delay element is reduced or not for the measured delay ("on" and "off", respectively). Proceeding from 0 to 3 in the phase difference, the reduction becomes less pronounced. The whole Table is chosen so that as the phase difference is greater, the oscillation frequency of the time-continuous oscillator decreases more strongly, so that the phase difference relative to the time-discrete oscillator is reduced.

Going back from a phase difference of 0 via 9 to 8 (corresponding to a phase difference of −0.2 periods), the reduction increases. As the phase difference is more negative, the oscillation frequency of the time-continuous oscillator will, therefore, increase more strongly, so that the phase difference relative to the time-discrete oscillator is reduced.

The control circuit 230 is operative to implement the above Table. To this end, it comprises, for example a ROM whereto the phase difference (left-hand column in the Table) is presented as an address and in which the desired combination of control signals for the delay elements is stored at the location associated with the relevant address.

For this method of frequency control, the delay time of a selected part of the delay elements is reduced. Consequently, the period of time required by the oscillation signal so as to traverse a single delay element 220a,b,c,d,e no longer amounts to exactly an integer part (1/N, where N is integer) of the period of the oscillation. The Table indicating the relationship between the signal values on the outputs of the delay elements 220a,b,c,d,e, therefore, is only approximately correct.

In order to minimize this error, it is advisable to control the delay elements 220a,b,c,d,e so that the delay elements having a reduced delay time are uniformly distributed over the chain of delay elements 220a,b,c,d,e. For example, if half the number of delay elements is to have a reduced delay time, the delay time of successive delay elements is alternately reduced and not reduced. In the above Table, for example for the phase 0 "on" and "off" control alternate as well as possible for successive delay elements 220a,b,c,d,e. Thus, the mean delay over several delay elements 220a,b,c,d,e will still constitute an integer part of a full period as accurately as possible.

Figure 4:
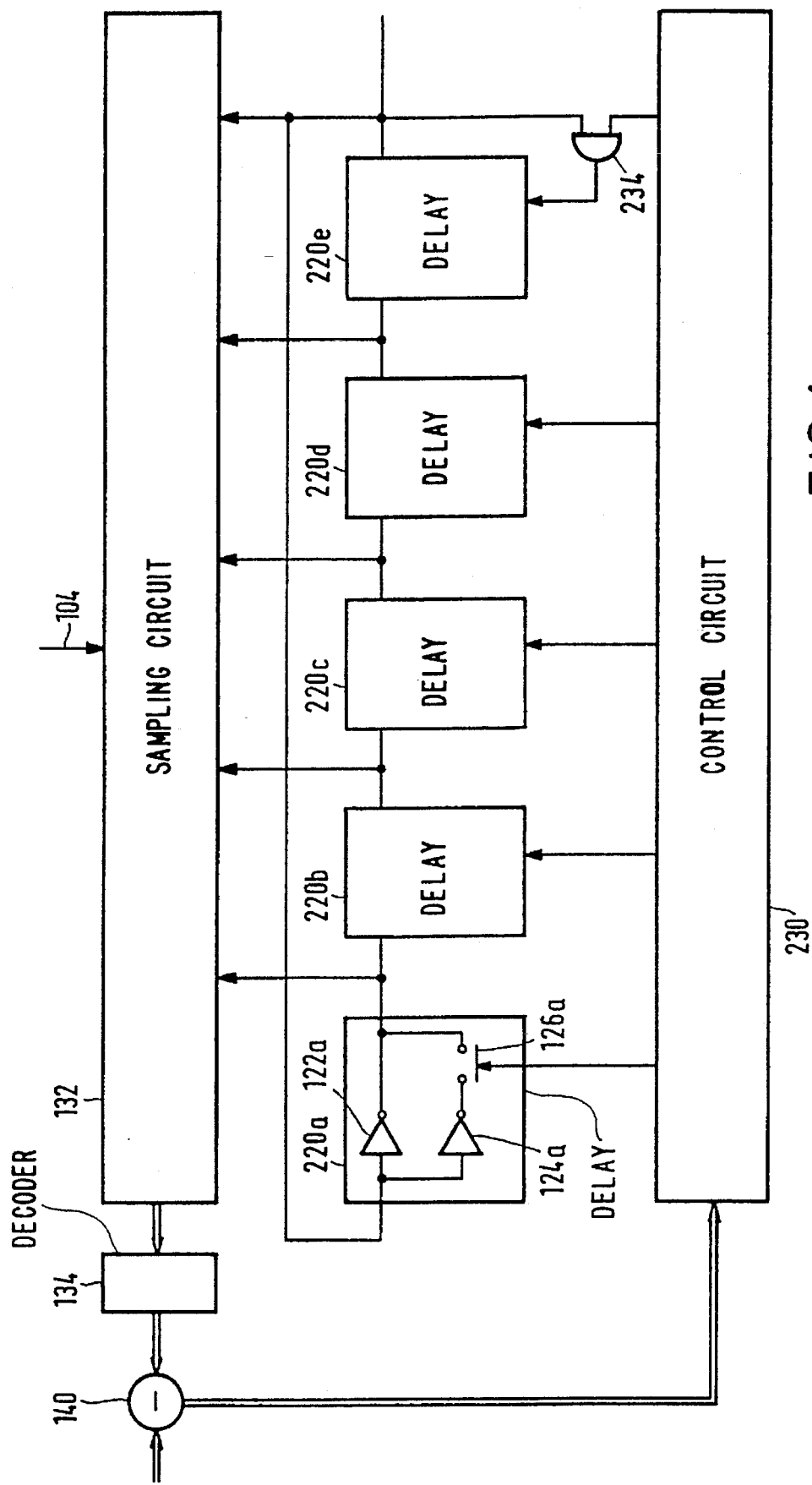
FIG. 4 shows a refined version of the circuit shown in FIG. 3.

FIG. 4 shows a refined version of the circuit of FIG. 3. Therein, the output of one of the delay elements 220e is retrocoupled to its control input, via an AND gate 234. The other input of the gate 234 is coupled to the control circuit 230.

During operation the retrocoupling of the output of one of the delay elements 220e to its control input offers a refined frequency control. This is because it enables to adjust the reduction of the delay time to be alternately short and long for successive half periods of the oscillation. On average per period the delay time can thus be adjusted with double the accuracy. The following Table shows an example of a usable relationship between phase difference and control of the delay elements 220a,b,c,d,e as realised by means of the control circuit 230 in this case:

| phase | a | b | c | d | e |
|---|---|---|---|---|---|
| 0 | on | off | on | off | off |
| 1 | off | off | on | off | on |
| 2 | off | off | on | off | off |
| 3 | off | off | off | off | on |
| 4 | off | off | off | off | off |
| 5 | on | on | on | on | on |
| 6 | on | on | on | on | off |
| 7 | on | on | on | off | on |
| 8 | on | on | on | off | off |
| 9 | on | off | on | off | on |

For a phase difference of 1, 3 and 5, 7, 9, the control of the AND gate 234 is "on", which means logic 1. The control signal of the one delay element 220e is then logic "1" if its output signal immediately before that was "1" and "0" if its output signal was "0". Thus, in each period the delay element 220e supplies one reduced and one normal delay time. For the other phase differences (1, 3, 6, 8) the control of the AND gate 234 is "off" and the delay element 220e will supply only normal delay times.

Figure 5:
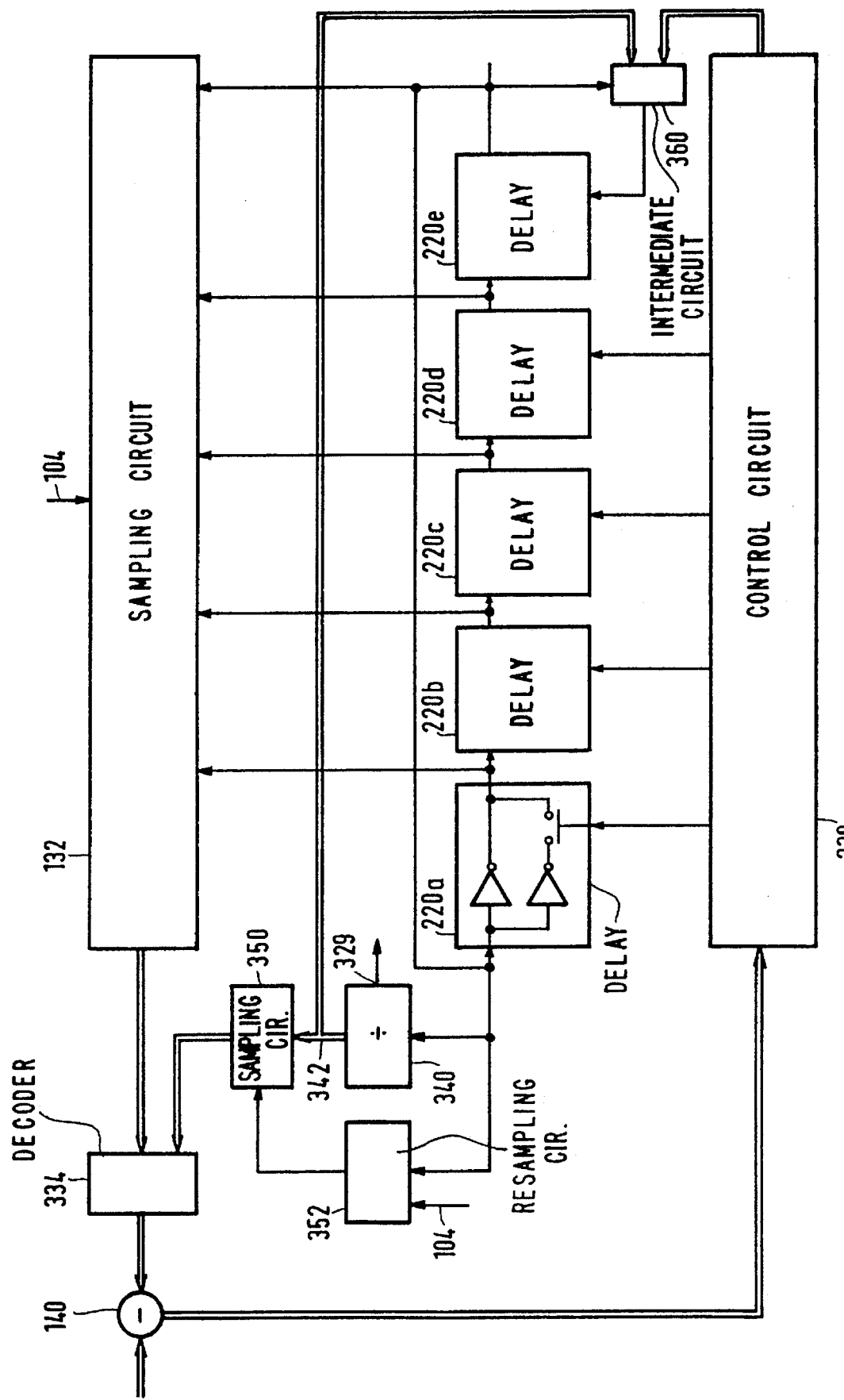
FIG. 5 shows a further circuit with phase control in accordance with the invention.

FIG. 5 shows a further circuit with phase control in accordance with the invention, elements corresponding to the FIGS. 1, 2 and 3 again being denoted by corresponding reference numerals. FIG. 5 also comprises a divider 340. An output of the chain of delay elements 220a,b,c,d,e is connected to an input of the divider 340. An output 329 of the divider 340 constitutes the output of the oscillator. A further output 342 of the divider 340 is connected to a further latch circuit 350. The further output 342 of the divider is also coupled to an intermediate circuit 360 insert between the control circuit 230 and one of the delay elements 220e. The intermediate circuit 360 also receives the output signal of the one delay element 220e.

FIG. 5 also shows a resampling circuit 352. The inputs thereof are connected to the output of one of the delay elements 220e, and to the clock line 104. An output of the resampling circuit 352 is coupled to a control input of the further latch circuit 350. The outputs of the latch circuit 132 and the further latch circuit 350 are coupled to the decoder 334.

During operation, the chain of the delay elements 220a, b,c,d,e supplies a basic signal which is divided by the divider 340, for example by a factor 4. The divider does so by counting each time four periods of the basic signal before starting a new period on the divider output 329. The further output 342 of the divider 340 indicates this count.

In response to each clock signal on the clock line 104, the output signals of the delay elements 220a,b,c,d,e as well as the count of the divider 340 are stored in the latch circuit 132 and in the further latch circuit 350, respectively. It must be ensured that the divider 340 is not sampled at an instant at which the count just changes. This is achieved by means of the resampling circuit 352 to be described hereinafter.

The decoder 334 subsequently determines, from the information stored in the latch circuits 132, 350, the phase of the divided signal, that is to say the signal on the output 329 of the divider 340. The following Table shows the relationship between the information stored and the phase to be realised by the decoder 334 for the example involving division by 4:

|       | 00 | 01 | 10 | 11 |
|-------|----|----|----|----|
| 01010 | 0  | 10 | 20 | 30 |
| 11010 | 1  | 11 | 21 | 31 |
| 10010 | 2  | 12 | 22 | 32 |
| 10110 | 3  | 13 | 23 | 33 |
| 10100 | 4  | 14 | 24 | 34 |
| 10101 | 5  | 15 | 25 | 35 |
| 00101 | 6  | 16 | 26 | 36 |
| 01101 | 7  | 17 | 27 | 37 |
| 01001 | 8  | 18 | 28 | 38 |
| 01011 | 9  | 19 | 29 | 39 |

The left-hand column contains the various feasible signals on the outputs of the delay elements 220a,b,c,d,e and horizontally at the top the various feasible counts of the counter 340 are shown. The Table states the phase values associated with the different combinations of delayed signals and counts in fortieth parts of one period of the divided signal.

The comparator 140 compares the phase values thus obtained by means of the decoder 334 with the phase values of the time-discrete oscillator. The numerical difference between these phase values is subsequently presented to the control circuit 230 which reduces the delay time of a part of the delay elements 220a,b,c,d,e. The number of delay elements 220a,b,c,d,e whose delay time is reduced is proportional to the phase difference measured. It is again advisable to distribute the differences in control of the delay elements 220a,b,c,d,e uniformly over the chain.

If desired, the intermediate circuit 360 can ensure that one of the delay elements 220e obtains a reduced delay time for only a part of the counts of the counter 340. This enables enhancement of the resolution of adjustment of the oscillation frequency of the time-continuous oscillator. For example, if the phase difference amounts to one fortieth of a period, the delay time of the one delay element can be reduced, for example for only one of the counts (for example, 00), for two of the counts (for example, 00 and 10) in case of a phase difference of two fortieth, etc.

The resolution of the frequency adjustment can be further enhanced by readjusting the delay time not during an entire period of the basic signal (i.e. the oscillation signal traversing the delay elements), but only during a half period, for example only when the signal of the one delay element 220 is logic 1, but not when it is logic 0. Thus, for a phase difference of 1, 2, 3, 4 fortieth of a period, for example the delay time can be reduced during 1, 2, 3, 4 half periods, respectively, of the basic signal.

Figure 6:
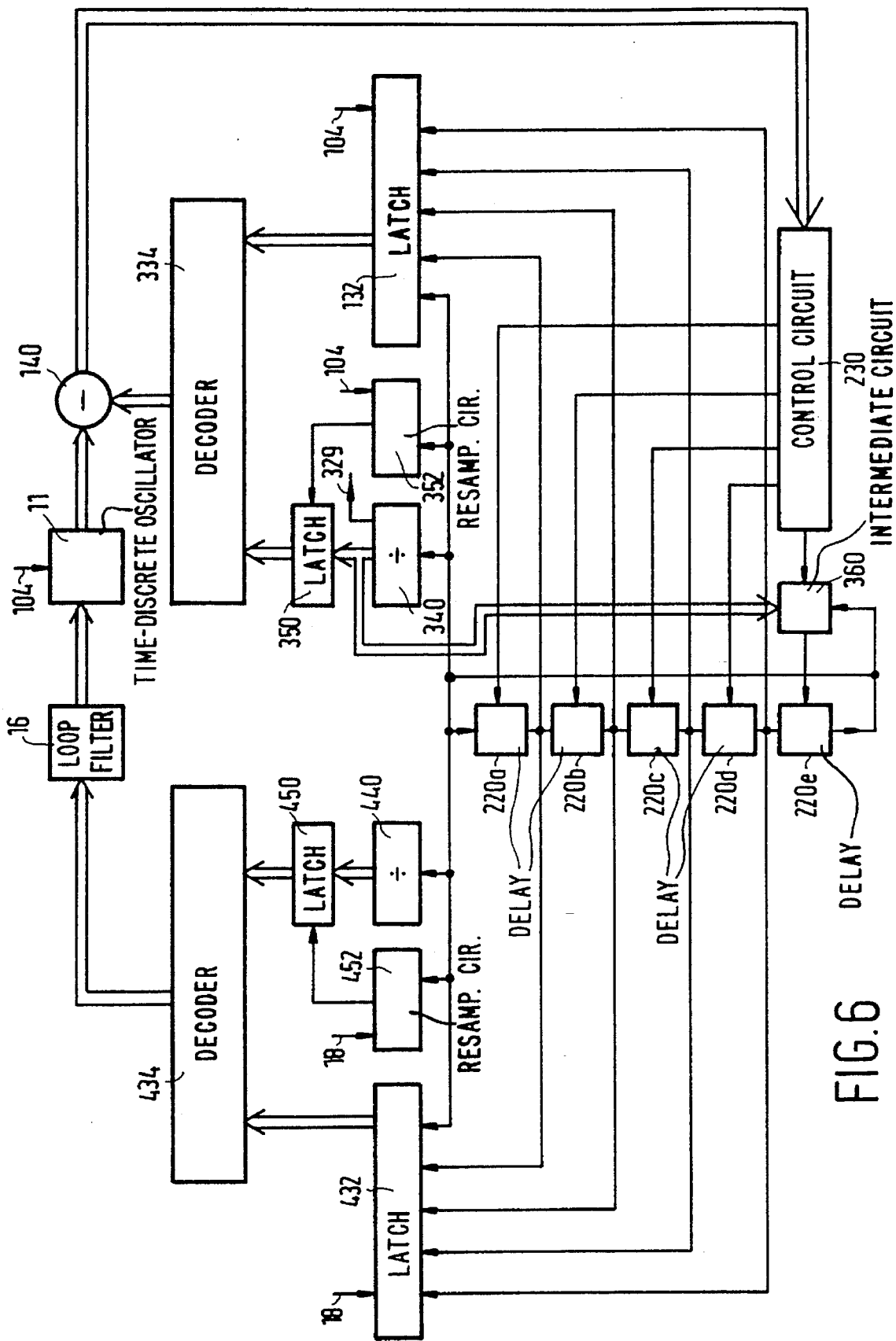
FIG. 6 shows a further circuit with phase control in accordance with the invention.

FIG. 6 shows a further circuit with phase control in accordance with the invention. Therein, the phase comparator 15 is also implemented while utilizing the delay elements 220a,b,c,d,e. In addition to the elements already shown, the circuit of FIG. 6 comprises a further divider 440, a further resampling circuit 452, a first and a second further latch 432, 450, and a decoder 434. An output of the chain of delay elements 220a,b,c,d,e of the time-continuous oscillator is coupled to an input of the further divider 440. The outputs of the delay elements 220a,b,c,d,e are coupled to the first further latch circuit 432. The count output of the further counter 440 is coupled to an input of the second further latch 450. An output of the first and the second further latch 432, 450 is coupled to the further decoder 434. The output of the further decoder 434 is coupled to the loop filter 16. The input 18 for the external signal is coupled to a control input of the latch 450. The output of one of the delay elements 220e and the input 18 for the external signal are coupled to the further resampling circuit. The further resampling circuit controls the second further latch 450.

During operation, in response to the external signal, the first further latch 450 will take a sample of the signals on the delay elements 220a,b,c,d,e. Furthermore, in response to the external signal the second further latch 450 will take a sample of the count of the divider 440. Subsequently, from the samples taken a phase is derived in the described manner, which phase in this case corresponds to the phase of the time-continuous oscillator relative to the external signal. This measured phase difference is used to readjust the frequency of the time-discrete oscillator 11.

Adjustment of the dividend of the dividers 340, 440 enables the implementation of a variety of combinations of frequencies. For the oscillation frequency of the crystal oscillator 10, for example 12 MHz can be used, and for the oscillation frequency of the discrete time oscillator 11 8, 6.75, 6 or 5.0625 MHz can be used; for example a quadruple of this frequency can be use, d for the ring oscillator 220a,b,c,d,e. It is to be noted that the frequency on the input 18 amounts to 15.625 Hz in the case of a European television synchronization signal. The signal on the output 329 of the divider 340 can then be used, for example as a sampling clock for the television signal, or as a clock for onscreen display (OSD) of information.

The resampling circuit 352 provides correct combined sampling of the signal of the time-continuous oscillator and of the count of the counter. The count is incremented each time in response to the beginning of periods of the time-continuous oscillation signal, be it after some delay. When the time-continuous oscillator signal and the count are simultaneously sampled, immediately after the beginning of the period, there is a risk that an obsolete count is sampled. When the time-continuous oscillator signal and the count are simultaneously sampled somewhat further from the beginning of the period, the beginning of the period will be taken up in the sampled count. Therefore, it is not unambiguously defined whether the sampled count is associated with the sampled value of the time-continuous oscillator signal or with the preceding value.

For a low-jitter phase loop it is important that associated samples are taken, or that at least the difference between the count at the instant of sampling of the time-continuous oscillation signal and the sampled count is unambiguously known (a fixed difference, for example, is not detrimental in as far as jitter of the phase-locked loop is concerned). Correct, simultaneous sampling of a count and a clock signal (as the time-continuous oscillation signal will be referred to in this context) whereby the counter is incremented, however, can be applied more broadly per se.

A first solution to this problem is to sample the count not simultaneously with the clock signal, but in synchronism with the beginning of the period of the clock signal. This procedure is as follows. In response to the reception of a sample signal, the clock signal is immediately sampled. The circuit subsequently awaits the beginning of a new period of the clock signal, and subsequently it waits for an additional period of time which suffices to execute the incrementation of the count. The count is sampled only after that. The sampled count will thus always be exactly one unit higher than at the instant of sampling of the clock signal, so that an unambiguous relationship exists between the samples of the clock signal and the count.

Evidently, it is also possible to wait for a predetermined number of periods until the next period commences. The count will then be too high by a predetermined number of units; this can be simply corrected, if necessary.

The additional time preferably corresponds to the duty cycle of the clock signal: the circuit can then sample the count in response to the return transition of the clock signal which cancels the transition at the beginning of the period.

Figure 7:
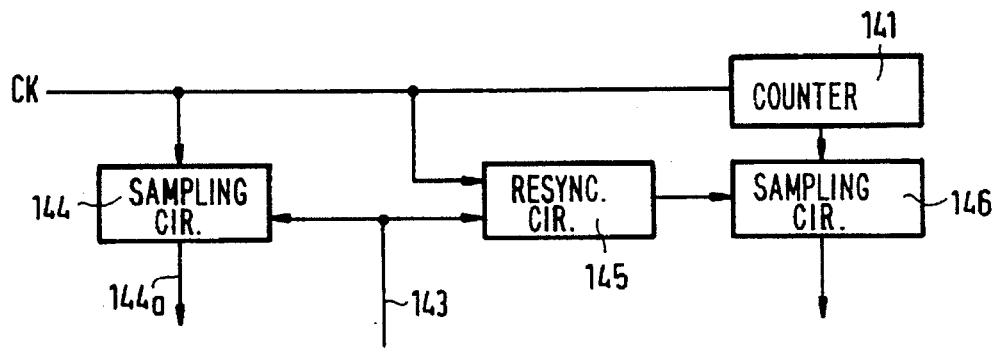
FIG. 7 shows a circuit for sampling the clock signal and the count.

FIG. 7 shows a circuit for sampling the clock signal and the count. The line CK for the clock signal is connected to the input of a counter 141. The line for the clock signal CK and an output of the counter are coupled to a signal input of a first sampling circuit 144 and a signal input of a second sampling circuit 146, respectively. A sample signal line 143 is coupled to a sample input of the first sampling circuit 144 which comprises an output 144a. The sample signal line 143 is coupled to the second sampling circuit via a resynchronization circuit 145.

During operation the first and the second sampling circuit 144, 146 take over the value of the clock signal CK and the position of the counter 141, respectively, in response to a sample signal on the sample signal line 143. The resynchronization circuit 145 delays the sample signal to an instant slightly after the beginning of the next period of the clock signal.

Figure 8:
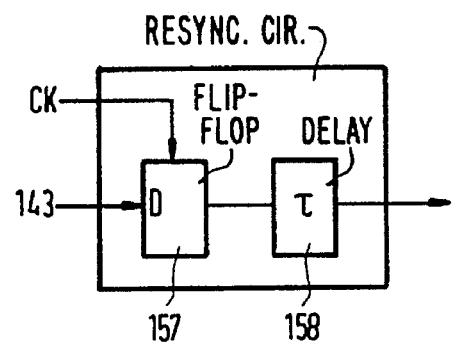
FIG. 8 shows an embodiment of the resynchronization circuit.

FIG. 8 shows an embodiment of the resynchronization circuit. It comprises a flipflop 157 and a delay circuit 158. The line for the sample signal 153 is coupled to a data input of the flipflop 157. The line for the clock signal CK is coupled to the clock input of this flipflop 157. The output of the flipflop 157 is coupled, via the delay circuit 158, to the sample input of the second sampling circuit 146 (not shown).

During operation, the flipflop 157 takes over signal transitions of the sample signal on the line 3 only at the beginning of the next period of the clock signal CK. In conjunction with the delay produced by the delay circuit, this take-over determines the instant at which the counter position is sampled.

For the described method of sampling it must be possible to detect the beginning of the next new period after the sampling of the clock signal. This imposes severe requirements in respect of timing. Sampling can be incorrect when the clock signal at the input of the counter has been delayed relative to the clock signal being sampled. In that case there is a risk that the beginning of the next period of the clock signal arriving at the counter has already been taken up in the sample taken. In that case it is not unambiguously determined whether the sampled count is associated with the sampled value of the clock signal or with the next value.

This problem may also occur due to delays of the sample signal. Some time will elapse between the reception of the sample signal and the instants at which the samples of the clock signal and the count are actually taken. Generally speaking, no signal is available which accurately indicates these instants.

This problem can be solved by rendering the sampling by the circuit dependent on the sampled value of the clock signal. For a clock signal of 50% duty cycle, it is assumed that the delay between the instant at which the result of a possible sampling of the clock signal would register the beginning of the period and the instant at which the clock signal on the input of the counter indicates the beginning of the period amounts to less than one half period of the clock signal. (When the duty cycle of the clock signal is not 50%, the principle remains the same, provided that the delay time is less than the duration of the smallest pan of the period in which the clock signal remains unchanged).

When the sampled clock signal has a first value which corresponds to the value directly before the beginning of the period, the beginning of the sampled period must have occurred at least one half period before the sampling instant; the beginning of the next period on the input of the counter, therefore, can originate only from the period after the sampled clock signal. The count sampled in response to the beginning of this period, therefore, is one unit higher than that at the instant of sampling of the clock signal.

When the sampled clock signal has a second value which corresponds to the value immediately after the beginning of the period, the point of reversal of the period preceding the sampled period has occurred at least one half period before the sampling instant. The next point of reversal of the clock signal on the input of the counter (whereby the clock signal returns from the second value to the first value), therefore, can originate from only after the sampled clock signal. The period on the input of the counter which first succeeds this point of reversal, therefore, is the first period after the sampling of the clock signal. When the count is sampled in response to the beginning of this period, the sample will again be exactly one unit higher than that at the instant of sampling.

This effect is used in the following sampling procedure. The clock signal is sampled in response to the sample signal. When the sampled clock signal has the first value, the next beginning of a period of the clock signal on the input of the counter is awaited. The count is sampled an additional period of time after this beginning (the additional time enables the counter to increment the count). When the sampled value of the clock signal has the second value, the next point of reversal in the clock signal on the input of the counter is awaited, and subsequently the next beginning of a period is awaited. The count is sampled the additional period of time after this beginning. The sampled count is thus always exactly one unit higher than that at the instant of sampling.

Figure 9:
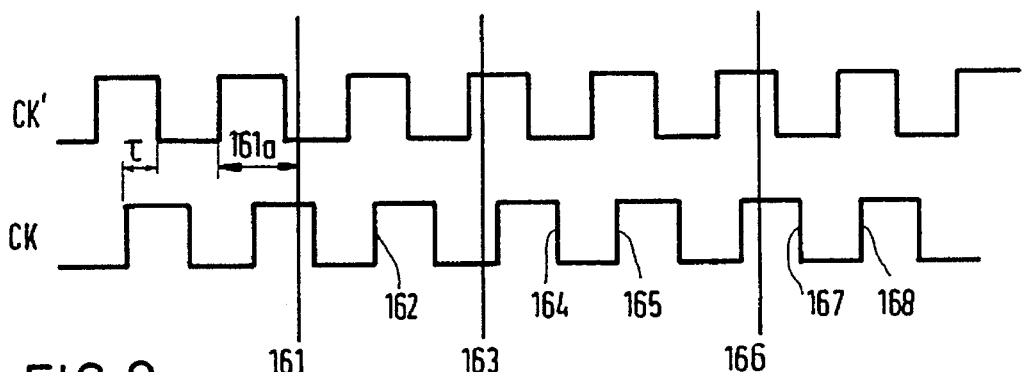
FIG. 9 shows two versions CK', CK of the clock signal.

This will be illustrated with reference to FIG. 9. This Figure shows two versions CK', CK of the clock signal as it is sampled and as it is present on the input of the counter, respectively. These signals have been delayed by a period τ relative to one another. The time dependency of the signal CK' reveals what the result of sampling would be at given instants; generally speaking, this signal is not accessible in time-dependent form in the circuit. It is assumed that the high-low transition of CK constitutes the beginning of the period where the incrementation of the counter starts.

When the instant at which the clock signal CK' is sampled occurs when this signal is low (vertical line 161), the last preceding low-high transition of the sampled signal CK' will be more than one half period ago, i.e. it will be situated outside the interval 161a. The next beginning of a period 162 of the signal CK for the counter, therefore, is associated with the beginning 162a of the first period of the sampled signal CK' occurring after the sampling instant.

When the instant of sampling of the clock signal CK' occurs when this signal is high (vertical lines 163 and 166), the next beginning of a period of the signal CK' on the input of the counter can correspond to the beginning of a period in the sampled clock signal CK' before as well as after the sampling instant (163 and 166, respectively). The beginning 165, 168 of the next period of the signal CK on the input of the counter, after the next point of reversal 164, 167, is associated with the beginning 162a of the first period of the sampled signal CK' occurring after the sampling instant.

The instant of sampling is thus determined in principle on the basis of signal transitions of the clock signal CK as it is present on the input of the counter. It is not necessary to use exactly this signal CK for the determination of the instant of sampling. Instead use can be made of a version CK" of the clock signal which has been delayed less than the signal CK on the input of the counter. This has no effect on the selected instant of sampling.

Conversely, small delays of the sample signal originating from the line 143 also have no effect on this instant, because the sample signal precedes the first relevant signal transition of the clock signal CK by at least a minimum time interval. The duration of this minimum time interval equals one half period of the clock signal CK minus the delay between the sampled clock signal CK' and the clock signal CK. Therefore, sampling is firmly protected against spreading errors in the timing.

Figure 10:
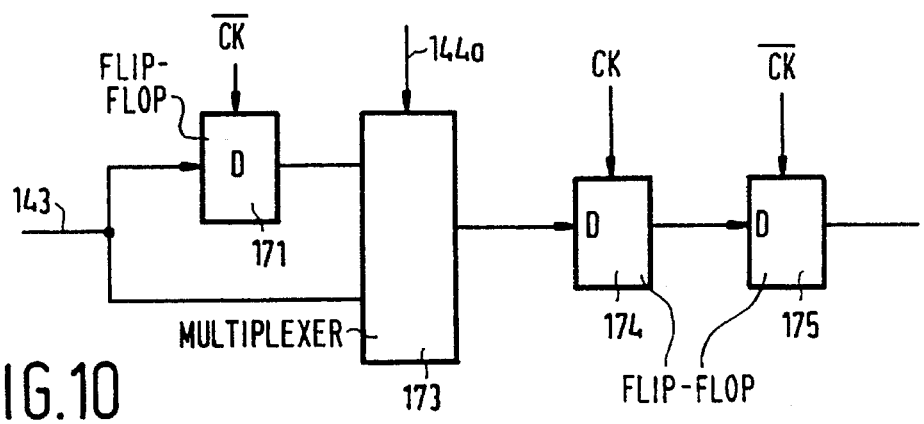
FIG. 10 shows a further embodiment of a resynchronization circuit.

FIG. 10 shows an embodiment of a resynchronization circuit which utilizes this principle. The line for the sample signal 143 is connected, directly and via a first flipflop 171, respectively, to the inputs of a multiplexer 173. The output of the multiplexer is coupled, via a cascade of a second and a third flipflop, to the sample input of the second sampling circuit (not shown). The first and the third flipflop are clocked by the inverse of the clock signal CK; the second flipflop is clocked by the clock signal CK. The multiplexer is controlled by the sampled clock signal 144a.

During operation, when the sampled clock signal is low, the multiplexer conducts the sample signal directly. The circuit shown in FIG. 10 then operates is exactly the same way as the circuit shown in FIG. 8: the second flipflop 174 generates a signal transition at the beginning of the first period of the clock signal CK after the signal transition of the sample signal. The third flipflop 175 provides a further delay; as an alternative to FIG. 8, this is not a fixed delay time but one half period of the clock signal CK; the sample instant, thus coincides exactly with the transition in the clock signal of the polarity whereto the counter does not respond.

When the sampled clock signal is high, the multiplexer conducts the sample signal via the first flipflop 171. The second flipflop 174 then generates a signal transition at the beginning of the first period after the first point of reversal of the clock signal CK after the signal transition of the sample signal.

Figure 11:
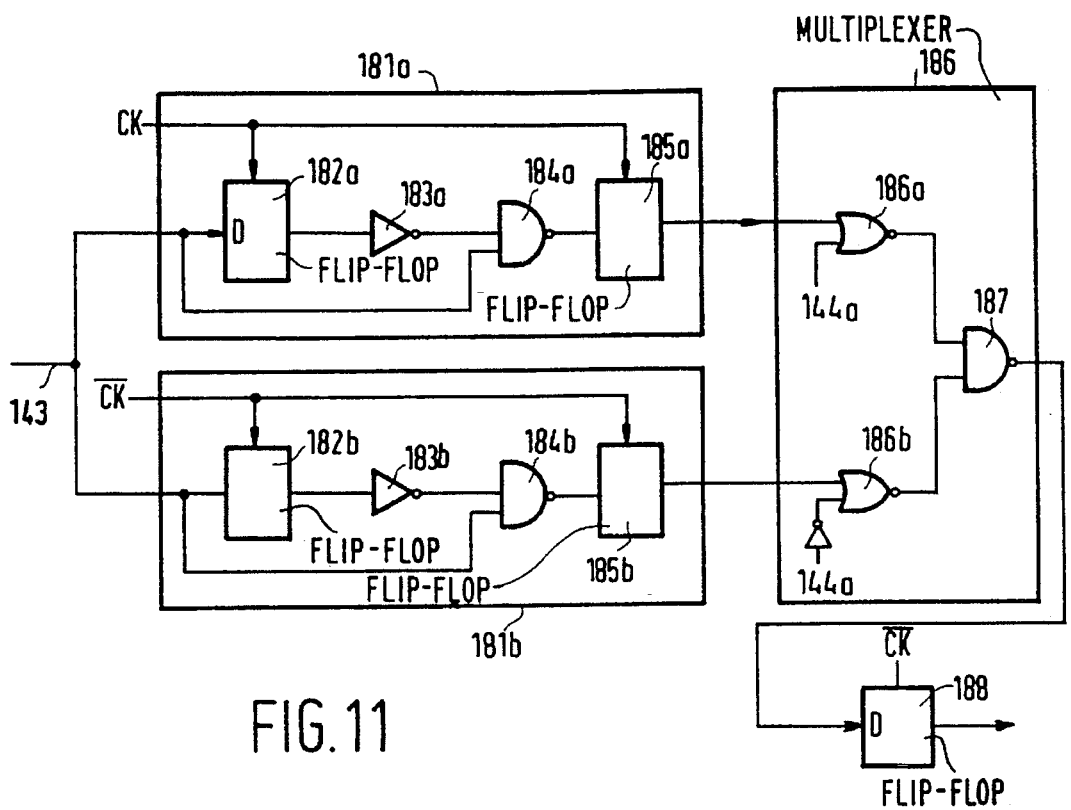
FIG. 11 shows a further embodiment of a resynchronization circuit.

FIG. 11 shows a further embodiment of a resynchronization circuit utilizing this principle. The line for the sample signal 143 is coupled to a multiplexer 186 via two branches 181a,b. The output of the multiplexer 186 is coupled, via an output flipflop 188, to the sample input of the second sampling circuit (not shown).

Each branch comprises a cascade connection of a flipflop 182a, b, an inverter 183a,b, a NAND-gate 184a,b, and a flipflop 185a,b. In each branch the line for the sample signal 143 is coupled to the dam input of the flipflop 182a,b and to an input of the NAND-gate 184a,b. The flipflops 182a, 185a in one branch are clocked by the clock signal CK on the input of the counter, whereas the flipflops 182b, 185b in the other branch are clocked by the inverse of this signal.

In the multiplexer 186 the outputs of the branches are connected to a NAND-gate 187 via respective OR-gates 186a,b. The output of the NAND-gate 187 is coupled to the data input of the output flipflop 188. The OR-gates 186a,b also receive the sampled clock signal and its inverse, respectively, the branch 181a which is clocked by the clock signal CK being coupled to the input of the OR-gate 186a which receives the sampled clock signal, whereas the branch which is clocked by the inverted clock signal is coupled to the input of the OR-gate 186a which receives the inverted sampled clock signal.

During operation, the two branches form pulses in response to the high-low transition in the sample signal: in one branch 181a these pulses start and terminate at the next low-high transitions of the clock signal CK, and in the other branch 181b at the next high-low transitions. Both pulses have the duration of one clock period. In dependence on the sampled value of the sampled clock signal CK', the multiplexer 186 conducts one of the two pulses. In response to the high-low transition of the clock signal CK on the input of the counter, the conducted pulse is taken over by the output flipflop 188.

In the case of a low sampled value of the clock signal CK' (case 161 in FIG. 9), the output flipflop 188 thus outputs a pulse in response to the first reversal transition after the beginning of the first period after the sample signal. In the case of a low sampled value of the clock signal CK' (case 163, 166 in FIG. 9), the output flipflop supplies a pulse in response to the second reversal transition after the sample signal.

Alternatively, the count can always be sampled in synchronism with the beginning of the next period of the clock signal on the input of the counter. In that case the sampled count should be incremented by one unit when the sampled clock signal has the second value and, after the sampling of the clock signal, the next beginning of a period on the input of the counter is not preceded by a point of reversal.

The foregoing can be summarized in that the circuit thus comprises an input for a clock signal having periods which commence with a transition from a first to a second logic level, and a counter which is operative to change its count in response to the beginning of a period. It also comprises a sampling circuit for sampling the clock signal and the count in a coherent fashion. This sampling circuit is operative to sample the count in synchronism with a beginning of a period of the clock signal.

The number of starting instants of further periods between the sampling of the clock signal and the beginning of the period in synchronism with which the count is sampled is then known. This number is known by measurement or because it is predetermined. Synchronization implies that the sampling occurs with a fixed delay after the beginning of the period, for example at the instant at which the clock signal returns from the second level to the first level, or an integer number of periods later.

The circuit also comprises correction means in order to obtain, in the event that the clock signal has been sampled at the second level and no transition from the second to the first level occurs in the clock signal between the sampling of the clock signal and a next beginning of a period, a sampled count which has been incremented by one unit in comparison with all other cases. This is achieved, for example by sampling the count one period later in this case.

In the foregoing the delay elements have been shown, by way of example, as inverters comprising single outputs. Instead it is also possible to use symmetrical buffers (that is to say, buffers comprising differential inputs and a normal as well as an inverting output) as delay elements.

Figure 12:
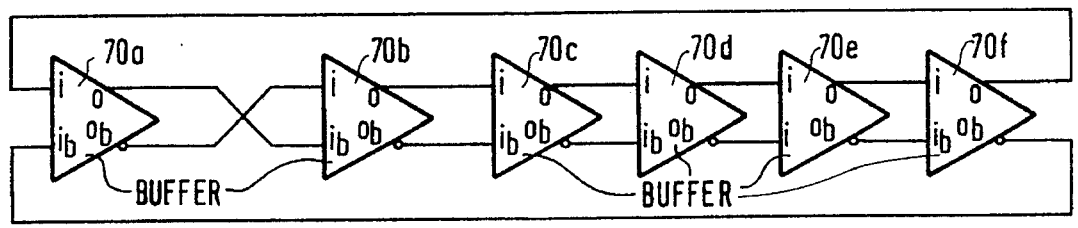
FIG. 12 shows an end-around coupled delay chain with symmetrical buffers.

FIG. 12 shows a delay chain which is coupled end-around and which comprises symmetrical buffers 70a,b,c,d,e,f. Each buffer comprises a pair of inputs i, ib and a pair of outputs o, ob. In a full loop along the chain, the gain is negative (because the input and the output between two buffers 70a, 70b are cross-wise coupled: o to ib and i to ob). The relationship between the phase of the signal in the chain and the phase of the oscillation signal is then given by the following Table, in which each line represents a combination of logic states of the outputs "o" of successive buffers in the left-hand column, whereas the right-hand column shows the associated phase in twelfth parts of 360 degrees.

| | |
|---|---|
| 000000 | 0 |
| 010000 | 1 |
| 011000 | 2 |
| 011100 | 3 |
| 011110 | 4 |
| 011111 | 5 |
| 111111 | 6 |
| 101111 | 7 |
| 100111 | 8 |
| 100011 | 9 |
| 100001 | 10 |
| 100000 | 11 |

The use of symmetrical buffers 70*a,b,c,d,e,f* offers the advantage that an even number of buffers 70*a,b,c,d,e,f* can be used in the chain. The buffers whose delay time is readjusted can thus be more uniformly distributed over the chain. The inaccuracy of measurement of the phase due to readjustment of the delay time is thus reduced.

For the sampling of the oscillator use can also be made of differential symmetrical circuits. This eliminates phase sampling errors, which are dependent on the logic value of the sampled signal due to any asymmetry between delays for signals of different logic levels.

Figure 13:
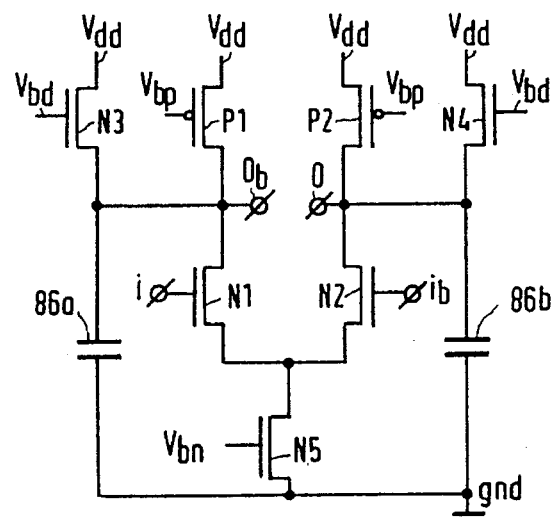
FIG. 13 shows a symmetrical buffer.

FIG. 13 shows a symmetrical buffer. It comprises an NMOS transistor N5 whose source is coupled to a first power supply (gnd). The drain of the NMOS transistor N5 is coupled, via two parallel branches, to a second power supply. Each branch comprises an NMOS switching transistor N1, N2 whose source is coupled to the drain of the NMOS transistor N5. The drains of the switching transistors N1, N2 are connected, via respective parallel connections of a PMOS load transistor P1, P2 with a clamp transistor N3, N4, to the second power supply $V_{dd}$. The gates of the switching transistors N1, N2 constitute the inputs i, ib of the buffer. The drains of the switching transistors N1, N2 constitute the outputs o, ob of the buffer. Between the outputs o, ob and the first power supply (gnd) capacitors 86*a,b* are shown in FIG. 13. The switching transistors N1, N2 have the same dimensions; the same holds for the load transistors P1, P2.

During operation, the gate voltages $V_{bn}$ and $V_{bp}$ of the NMOS transistor N5 and the PMOS load transistors P1, P2 are controlled so that the current I through the PMOS transistors P1, P2 in the saturated condition amounts to half the current 2I through the NMOS transistor N5. The signal on the input i, ib switches the switching transistors N1, N2 from a position in which the current flows from the NMOS transistor N5 to one of the PMOS load transistors P1, P2 to a position in which this current flows to the other P1, P2. In the one position one of the capacitors, say 86*a*, is charged by a net current amounting to I, whereas the other capacitor 86*b* is discharged by a net current amounting to I.

Consequently, the amount of charge across the one capacitor 86*a* increases linearly in time. As a result, the voltage on the corresponding output ob also increases linearly in time. This continues until the increasing voltage brings the load transistor P1 out of the saturated state, after which the charging current decreases. The voltage on the other output "o" decreases linearly in time. This continues until the voltage "o" on this output decreases to the clamp voltage $V_{bd}-V_{th}$ at which the clamp transistor N4 is turned on. In the other position of the switching transistors N1, N2, the voltage on the output ob decreases linearly as a function of time until it reaches $V_{bd}-V_{th}$ (N3 is turned on when its source voltage is below its gate voltage $V_{bd}$ by an amount equal to a threshold voltage $V_{th}$). The voltage on the other output "o" increases linearly until the load transistor P2 is no longer saturated.

The switching time of the buffer is approximately equal to the period of time required to reverse the polarity of the difference between the voltages on the outputs o, ob. This time is proportional to the current I through the load transistors P1, P2.

The clamp transistors N3, N4 render the switching time independent of the saturation properties of the switching transistors N1, N2 and the NMOS transistor N5. This is achieved in that the clamp transistors N3, N4 determine the lowest voltages on the outputs o, ob, and hence the voltage difference to be overcome by the buffer by charging the capacitors 86*a*, 86*b* before reversal of the polarity of the difference between the output voltages. This is attractive because the effect of temperature variations and a spread in the process parameters on the NMOS transistor N5 and the switching transistors N1, N2 thus has no effect on the switching time. A similar independence can be achieved by replacing the clamp transistors N2, N3, for example by diodes which also limit the minimum voltage to be reached. In that case this voltage is limited to the diode threshold voltage and cannot be adjusted.

The capacitors 86*a,b* can be explicitly provided, but in order to achieve an oscillator with an as high as possible frequency it suffices to utilize the parasitic capacitances always present in the circuit, so that no discrete capacitors need be provided.

It is one of the objects of the invention to realise the advantages of the digital technique in a phase loop. Attention is focused notably on the advantage that the functional behaviour of digital circuits is insensitive to a spread in the parameters of the circuit used. In the phase loop as described above, the ring oscillator constitutes the main component whose behaviour is still sensitive to parameter spreads. It is a problem notably that the ratio of the delay times realised with different settings of the buffer is sensitive to process parameters. This ratio, together with the instantaneous oscillation frequency, is decisive in respect of loop gain, and hence in respect of dynamic behaviour of the phase loop which must be as reproducible as possible.

The absolute delay time can be adjusted by adjusting the voltages $V_{bn}$ and $V_{bp}$, and hence the charging current I. However, it has been found that when it is attempted to realise different delay times in this manner, the parameters of the transistors have an effect on the ratio of the adjusted delay times.

Figure 14:
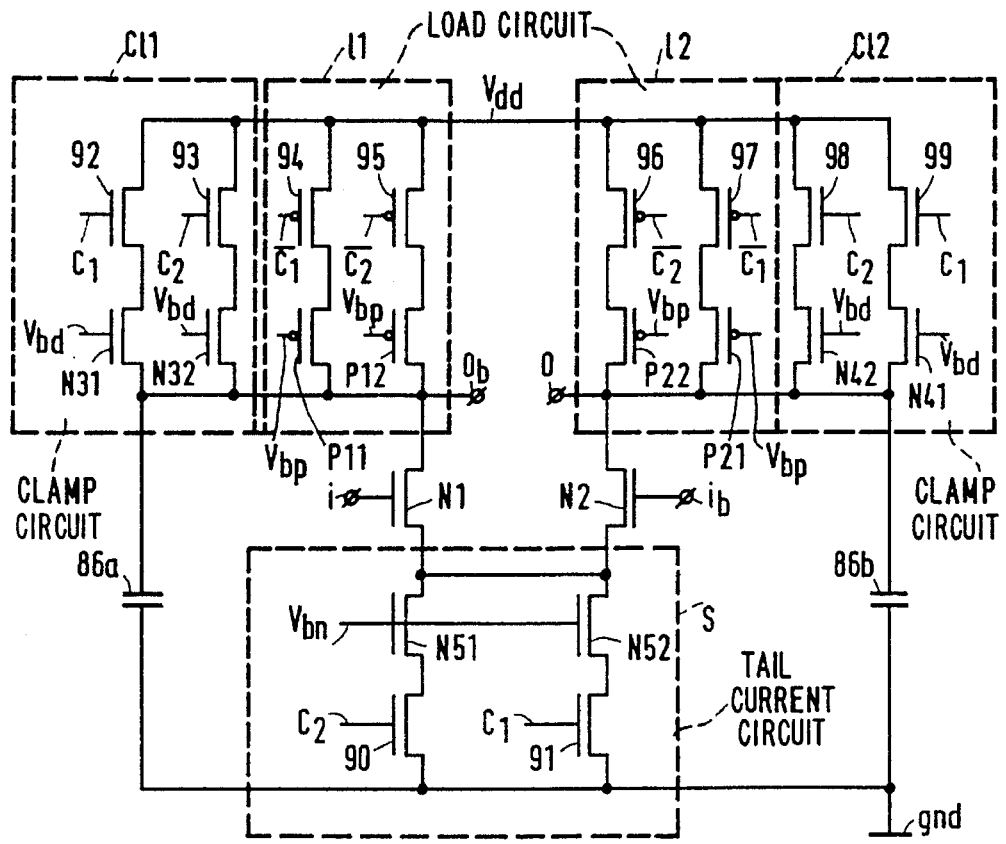
FIG. 14 shows a buffer circuit in which the ratio of the adjustable delay times is less dependent on the parameters of the transistors.

FIG. 14 shows a buffer circuit in which the ratio of the adjustable delay times is less dependent on the parameters of the transistors. The circuit is similar to that of FIG. 13, and elements having the same function therein are denoted by the same symbols. The difference consists in that the NMOS transistor N5 has been replaced by a tail current circuit S which comprises a parallel connection of two series connections, each of which includes the channel of a respective NMOS current transistor N51, N52 and a current source switching transistor 90, 91. Furthermore, the drains of the switching transistors N1, N2 are connected to the second power supply $V_{dd}$ via switchable load and clamp circuits L1, L2, CL1, CL2.

Each of the load circuits L1, L2 comprises, connected in parallel, two series connections of a respective PMOS load switching transistor 94, 95, 96, 97 and a current-controlling PMOS transistor P11, P12, P21, P22. Each of the clamp circuits CL1, CL2 comprises, in parallel, two series connections of a respective NMOS clamp switching transistor 92, 93, 98, 99 and an NMOS clamp transistor N31, N32, N41, N42. For each circuit on the one output o there is provided a corresponding circuit on the other output ob, both circuits having substantially the same dimensions, because the dimensions are the same, the output signals are almost fully symmetrical.

During operation the NMOS current source transistors N51, N52 in the tail current circuit S have the same function as the NMOS transistor N5 in FIG. 13 (supplying a current 2I), be it that the current 2I supplied under the control of the voltages $C_1$, $C_2$ on the respective gates of the current source switching transistors 90, 91, is switched between different values.

The current-controlling PMOS transistors P11, P12, P21, P22 in the load circuits L1, L2 have the same function as the load transistors P1, P2 in FIG. 13 (supplying a current I), the difference existing in that under the control of the voltages $\bar{C}_1$, $\bar{C}_2$ (being the logic inverse of $C_1$, $C_2$) on the respective gates of the load switching transistors 94, 95, 96, 97 the current I supplied can be switched between different values in conjunction with the switching of the current 2I by the tail current circuit S.

The NMOS clamp transistors N31, N32, N41, N42 in the clamp circuits CL1, CL2 have the same function as the clamp transistors N3, N4 in FIG. 13 (limiting the minimum voltage), be it that under the control of the voltages $C_1$, $C_2$ on the respective gates of the clamp switching transistors 92, 93, 98, 99 different clamp transistors N31, N32, N41, N42 are activated and deactivated.

For each circuit controlled by $C_1$ there is provided a functionally corresponding circuit which is controlled by $C_2$. The functionally corresponding circuits always have the same structure. Moreover, the ratio of the dimensions of the corresponding circuits is the same for all circuits: the ratio of the dimensions of the clamp circuit controlled by $C_1$ to those of the clamp circuit controlled by $C_2$ is equal to the ratio of the dimensions of the load circuit controlled by $C_1$ to those of the load circuit controlled by $C_2$; the same holds for the tail current circuits. Furthermore, the ratio of all kinds of parasitic effects will also be approximately the same. This ensures that the ratio of the adjusted delay times is reasonably independent of the parameters of the transistors.

Because the clamps C11, CL2 can also be switched and are switched together with the loads and the tail current source, the ratio of the currents for the different logic values of the voltages $C_1$ and $C_2$ is independent of the parameters of the transistors, so that the buffer is very suitable for use as a switchable delay element in a digitally controlled phase loop.

In FIG. 14 two switching voltages $C_1$ and $C_2$ are used by way of example, but evidently additional independent switching voltages ($C_3$ etc.) can also be used. If only two switching positions are required, one voltage suffices and the other voltage, for example $C_2$, can be permanently connected to the positive power supply $V_{dd}$ (and its inverse $\bar{C}_2$ to the negative power supply (gnd)).

Figure 15:
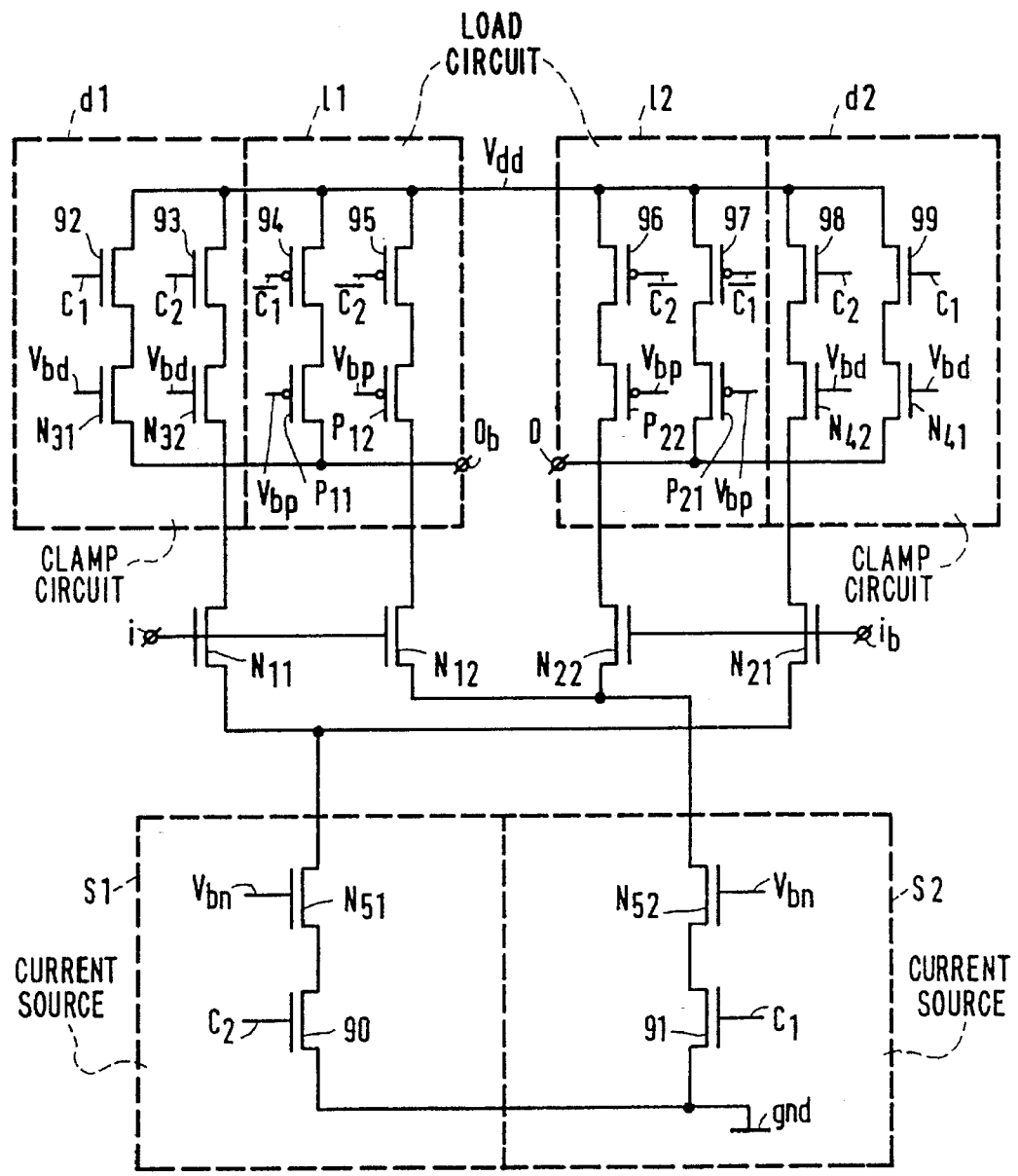
FIG. 15 shows a further embodiment of the buffer circuit.

FIG. 15 shows a further embodiment of the buffer. This embodiment corresponds to that shown in FIG. 14, except that the switching transistors N1, N2 have also been doubled so as to form two pairs N11, N21 and N12, N22, in each pair the sources being connected to one another and to a respective tail current source S1, S2. The sources of the different transistor pairs N11, N21 and N12, N22 and of the tail current sources S1, S2 are not connected to one another. The other elements of FIG. 15 have the same function as those shown in FIG. 14 and are denoted by the same symbols.

During operation the ratio of the currents occurring for the various values of the switching voltages $C_1$, $C_2$ is even less sensitive to variations in the parameters of the transistors. This can be attributed inter alia to the following. The difference between the voltages on the inputs i, ib normally increases linearly in time. As a result, there will be a time interval during which both switching transistors N1, N2 in the FIGS. 13 and 14 are turned on. The distribution of the current between these transistors is dependent on the parameters of these transistors, notably on their steepness. Because the switching transistors N1, N2 must switch different currents for different values of $C_1$ and $C_2$, the steepness influences the ratio of the switching times. In the circuit shown in FIG. 15, the switching transistors N11, N21 and N12, N22 are also effectively switched on and off by the signals $C_1$, and $C_2$, respectively. As a result, variations in the steepness of the switching transistors N11, N212, N21, N22 are irrelevant to the ratio of the delay times. This results in even better reproducibility of digital control circuits utilizing the buffer as a switchable delay element.

Figure 16:
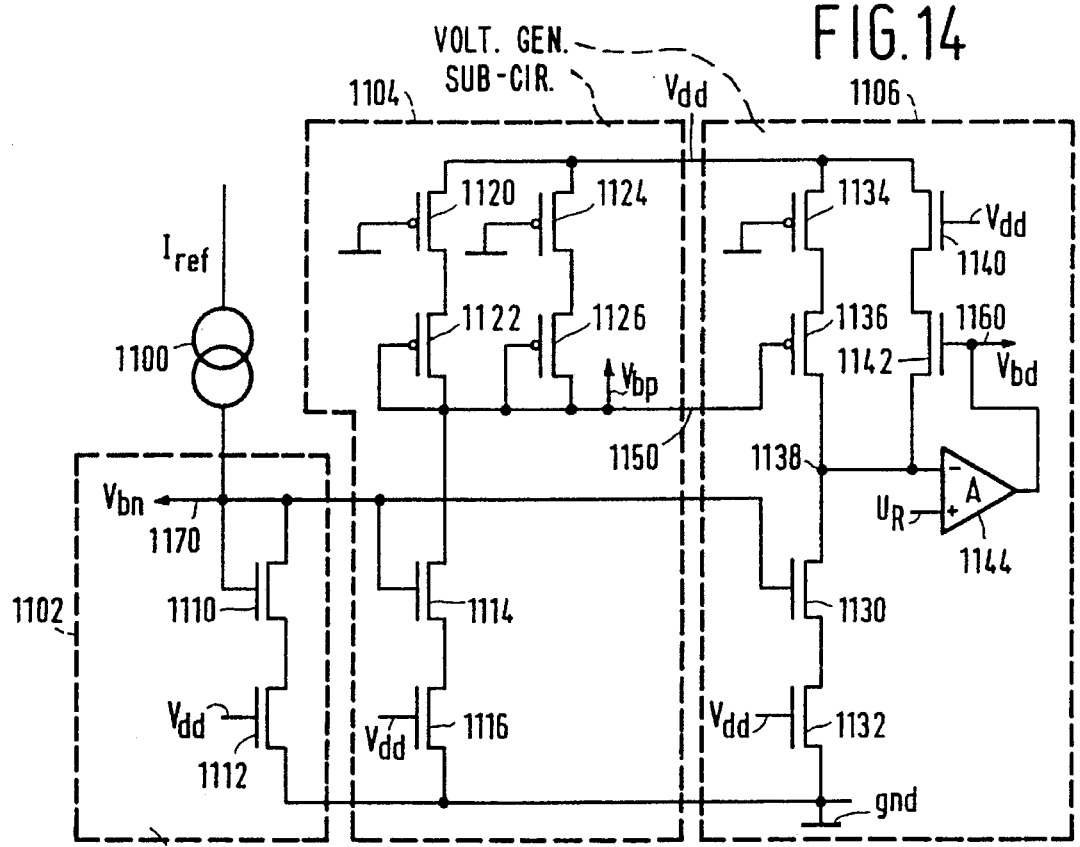
FIG. 16 shows a reference circuit for generating the reference voltages for the circuits shown in the FIGS. 13, 14 and 15.

FIG. 16 shows a reference circuit for generating the reference voltages $V_{bd}$, $V_{bn}$, $V_{bp}$ for the circuits shown in the FIGS. 13, 14 and 15. The reference circuit is a mirror-image of the buffer as shown, for example in FIG. 14. For each component of FIG. 14, with the exception of the switching transistors N1, N2, there is provided a corresponding circuit whereby an associated reference voltage is generated during operation. The reference circuit comprises sub-circuits 1102, 1104, 1106 for generating the voltages $V_{bn}$, $V_{bp}$ and $V_{bd}$ for the tail current circuits S, S1, S2, the load circuits L1, L2 and the clamp circuits CL1, CL2, respectively.

The sub-circuit 1102 for generating $V_{bn}$ comprises a series connection of the channels of two NMOS transistors 110, 1112 between a current source 1100 and the first power supply (gnd). These two transistors 1110, 1112 correspond to the tail current circuit S of FIG. 14. The gate of one of the transistors, 1110, is connected to its drain, the voltage $V_{bn}$ being tapped from this gate. The gate of the other transistor, 1112, is coupled to the second power supply $V_{dd}$. During operation the sub-circuit 1102 mirrors the reference current $I_{ref}$ to the tail current circuit S of the buffer by the coupling of $V_{bn}$.

The sub-circuit 1104 for generating $V_{bp}$ comprises two NMOS transistors 1114, 1116 which correspond to the transistors in the load circuits L1, L2. The two NMOS transistors 1114, 1116 are coupled to the transistors 1110, 1112 so that they form, in conjunction with the transistors 1110, 1112 of the sub-circuit 1102, a current mirror for mirroring the reference current $I_{ref}$. The output of this current mirror is connected, via a parallel connection of two series connections of the channels of PMOS transistors 1120, 1122, 1124, 1126, to the second power supply $V_{dd}$. The gate of one PMOS transistor 1122, 1126 in each series connection is connected to its drain. The voltage $V_{bn}$ is tapped from the drains of the transistors 1122, 1126. The gate of the other PMOS transistor 1120, 1124 is connected to ground. When transistors are used, the sub-circuit 1104 mirrors half the reference current to the load circuits L1, L2 via the coupling of $V_{bp}$.

The sub-circuit 1106 for generating $V_{bd}$ comprises two PMOS transistors 1134, 1136 which are coupled to the PMOS transistors 1120, 1122 so that they form a current mirror in conjunction with the transistors 1120, 1122 of the sub-circuit 1104. The output of this current mirror is connected to the first power supply via a series connection of the channels of two NMOS transistors 1130, 1132. The gate of one of these transistors, 1130, is coupled to $V_{bn}$, the gate of the other transistor, 1132, being connected to the second power supply $V_{dd}$. In parallel with the two PMOS transistors 1134, 1136 there is connected a series connection of the channels of two further NMOS transistors. These further transistors correspond to the transistors of the clamp circuits CL1, CL2. The junction 1138 of the PMOS transistors 1136, 1134 and the NMOS transistors 1130, 1132 is coupled to the inverting input of a control amplifier 1144. The output of this control amplifier is coupled to the gate of one of the further NMOS transistors 1160. The gate of the other further NMOS transistor is coupled to the second power supply $V_{dd}$. The non-inverting input of the control amplifier 1144 is connected to a reference voltage $U_R$. The control amplifier 1144 readjusts $V_{bd}$ SO that the clamp voltage for the given currents equals $U_R$. It has been found that $U_R=V_{dd}/2$ offers suitable results, but if the dependency on possible fluctuations in the supply voltage is undesirable, use can also be made of a reference voltage source, for example a bandgap reference.

Figure 17:
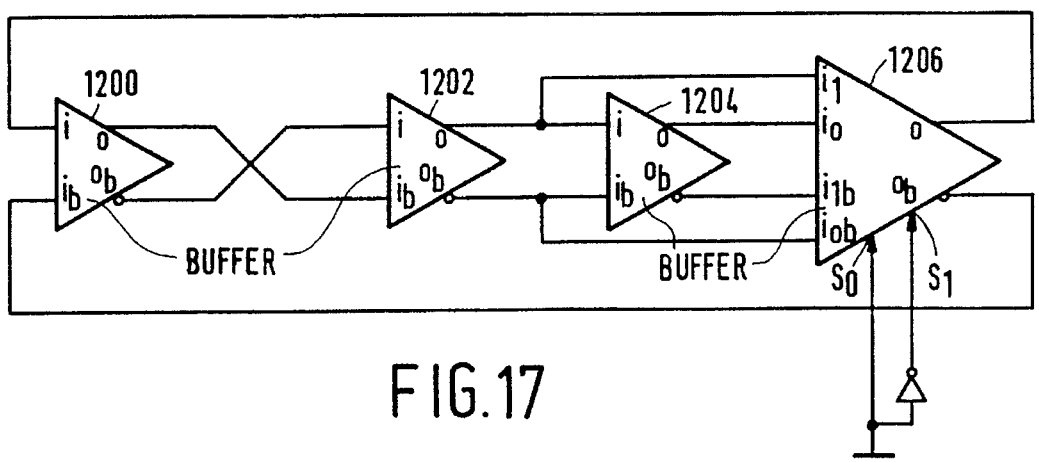
FIG. 17 shows a further ring oscillator.

FIG. 17 shows a further ring oscillator. This oscillator comprises, by way of example, four symmetrical buffer circuits 1200, 1202, 1204, 1206 which are connected in series. Only the first and the second symmetrical buffer circuits, 1200, 1202, are cross-wise coupled. As a result, the circular gain is negative. The outputs of the second buffer circuit 1202 as well as of the third buffer circuit 1204 are coupled to respective inputs of the fourth buffer circuit 1206. The fourth buffer circuit 1206 also constitutes a multiplexer and comprises control inputs S0, S1 which receive logically opposed signals. This controls which of the input signals is applied to the outputs.

During operation, the number of buffer circuits in the ting oscillator, and hence the oscillation frequency, can be controlled by way of the control inputs S0, S1. This is further mechanism which can be used for digital control of the frequency of a ring oscillator.

Only one of the buffer circuits in FIG. 17 is a multiplexer. It is alternatively possible to include several multiplexers in the ring oscillator, so that a larger or smaller part of the buffer circuits in the ring oscillator can be skipped in a controlled manner so as to achieve digital control of the oscillation frequency.

Figure 18:
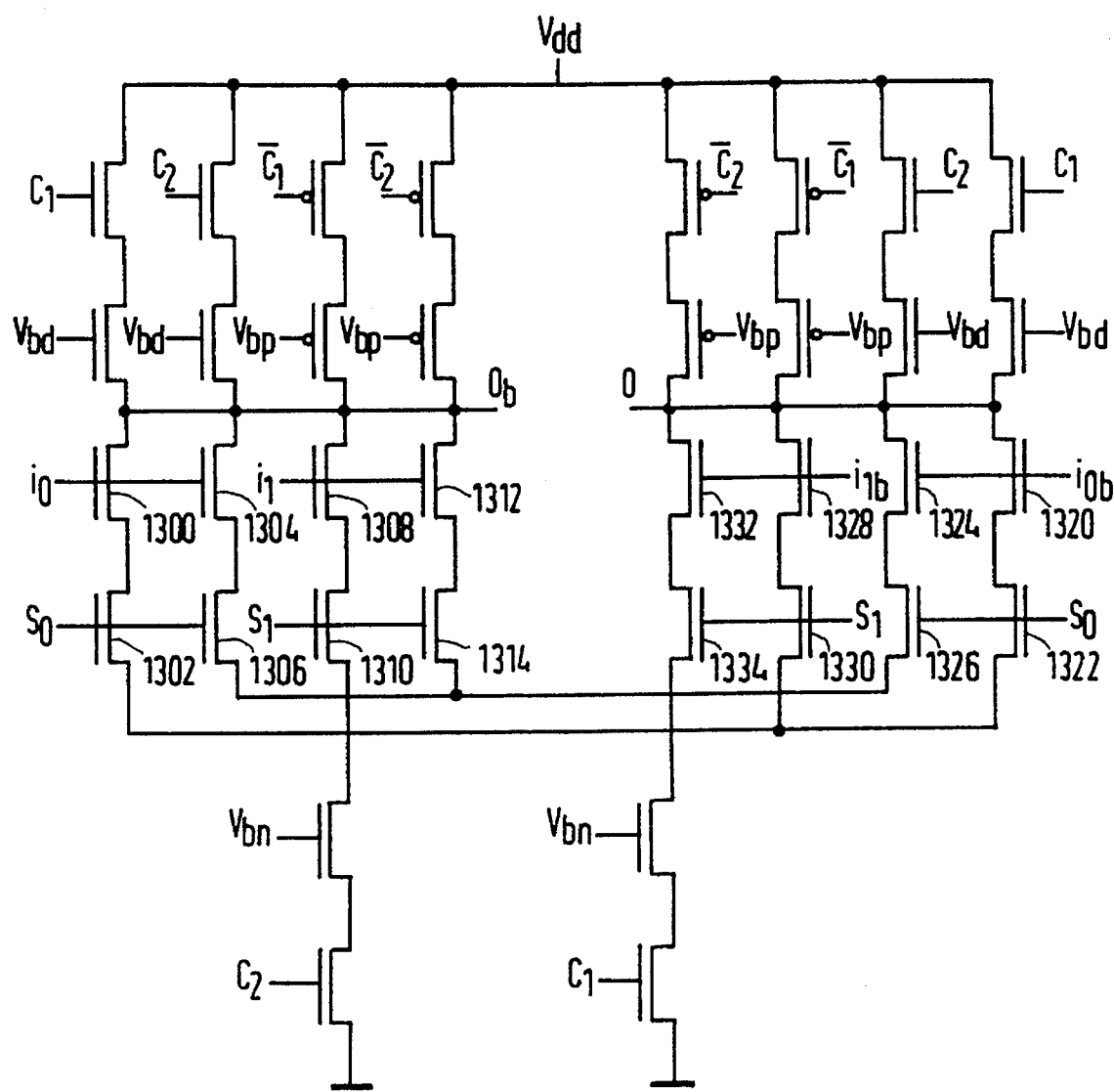
FIG. 18 shows an embodiment of a buffer circuit which also serves as a multiplexer.

FIG. 18 shows an embodiment of the buffer circuit which also serves as a multiplexer. The majority of the components correspond to those of FIG. 15 and is not elaborated. The difference with respect to FIG. 15 consists in that the switching transistors N11, N12, N21, N22 of FIG. 15 have been replaced in FIG. 18 by a respective parallel connection of two series connections of the channels of two transistors (N11 replaced by 1300, 1302 in series and 1308, 1310 in series; N12 by 1304, 1306 in series and 1312, 1314 in series; N21 by 1320, 1322 in series and 1330, 1328 in series; N22 by 1324, 1326 in series and 1332, 1334 in series).

During operation, each time one of every two parallel-connected series connections is activated by means of S0, S1. One of the inputs signals i1, i0 corresponds to each S0, S1. Consequently, always only of the input signals i1, i0 is active. The active input signal determines, in the manner described with reference to the FIGS. 13, 14, 15 and 11, the load circuit whereto the current flows. The signals on S0, S1 determine which of the input signals i1, i0 is applied to the output o, ob in this manner.

It will be evident from the foregoing that the invention provides a substantially completely sampled and digitally operating phase loop circuit. Because of its fast and accurate response to the frequency control signal on the input 116, this circuit is suitable notably for use as the VCO 1 in the circuit shown in FIG. 1, but it can also be used for other applications.

A variety of embodiments are feasible without departing from the scope of the invention. For example, in the time-continuous oscillator delay elements other than inverters can be used. For example, the functions of phase measurement and generating the time-continuous oscillation can be separated by connecting, in series with the chain 122a, 122b, 122c, 122d, 122e, 124a, 124b, 124c, 124d, 124e of delay elements, a further chain of further delay elements which are controlled in the same way as the elements 122a, 122b, 122c, 122d, 122e, 124a, 124b, 124c, 124d, 124e, taps of said further chain being connected to the latch 132.

Furthermore, for example the time-discrete oscillator need not produce a sampled sawtooth signal. Other signals, for example a sampled sinewave can also be used because in principle they are nothing but distorted phase signals.

In order to enable phase comparison between the time-continuous oscillator and the time-discrete oscillator during the entire oscillation period, the decoder 134 must be adapted so as to ensure that the phasemeter 130 produces output signals which depend on the phase of the time-continuous oscillator in the same distorted manner. Alternatively, a further decoder can be added so as to convert the signal values of the time-discrete oscillator into non-distorted phase values before comparison with the output signals of the phasemeter. Both decoders can be realised, for example by means of a ROM.

We claim:

1. An integrated circuit, comprising:

a clock circuit for generating a clock signal;

a time-discrete oscillator for generating a time-discrete oscillation signal which contains an associated time-discrete signal value for each period of the clock signal;

a time-continuous oscillator for generating a time-continuous oscillation signal; and a phase-locked loop for measuring a phase difference between the time-discrete oscillation signal and the time-continuous oscillation signal, and for readjusting a frequency of the time-continuous oscillator under the control of the phase difference, characterized in that the phase-locked loop comprises:

a phase meter coupled to the time-continuous oscillator for measuring a sampled phase value of the time-continuous oscillation signal for each period of the clock signal; and a comparator circuit for determining the phase difference for each period by comparing the sampled phase value in a relevant period with the time-discrete signal value associated with the relevant period.

2. An integrated circuit as claimed in claim 1, characterized in that said time-continuous oscillator comprises a delay chain with an input for receiving a basic signal of the time-continuous oscillation signal, and two or more taps for tapping respective, mutually delayed signals, said two or more taps being coupled to the phase meter for sampling, the phase meter comprising decoding means for decoding the sampled phase value from the mutually delayed signals.

3. An integrated circuit as claimed in claim 2, characterized in that at least one of the taps of the delay chain of the time-continuous oscillator is retrocoupled to the input of the delay chain in order to generate the basic signal, and in that the phase-locked loop is operative to readjust a delay time of a part of the delay chain which is dependent on the measured phase difference.

4. An integrated circuit as claimed in claim 2, in which at least one of the taps is retrocoupled to the input of the delay chain in order to generate the basic signal, characterized in that the phase-locked loop is operative to readjust a delay time of the delay chain during a part of each period of the basic signal, said part being dependent on the measured phase difference.

5. An integrated circuit as claimed in claim 2, characterized in that the delay chain comprises a chain of first binary delay elements, and second binary delay elements, said second binary delay elements being connectable in parallel to said first binary elements in dependence on the phase difference in order to readjust the frequency by variation of a charging or discharging speed of outputs of the first binary delay elements.

6. An integrated circuit as claimed in claim 2, characterized in that the time-continuous oscillator further comprises a divider for generating the time-continuous oscillation signal by frequency division of the basic signal, the divider comprising a counting output which is coupled to the decoding means, said decoding means determining the phase value from the mutually delayed signals and forming a count of a number of periods of the basic signal having passed since a beginning of a period of the time-continuous oscillation signal.

7. An integrated circuit as claimed in claim 2, characterized in that the phase meter comprises a latch circuit having inputs connected to the taps, and outputs connected to the decoding means, said latch circuit further having a clock input coupled to receive the clock signal from the clock circuit, whereby the latch circuit samples the mutually delayed signals.

8. An integrated circuit as claimed in claim 1, characterized in that the integrated circuit further comprises a further phase-locked loop for readjusting a frequency of the time-discrete oscillator in dependence on a phase difference between the time-continuous oscillation signal and an external signal.

9. An integrated circuit as claimed in claim 8, characterized in that the further phase-locked loop comprises a phase comparator which includes a further delay chain, a further divider and further decoding means, said phase comparator receiving the time-continuous oscillation signal on an input of the further delay chain, the phase comparator sampling, in response to a signal transition of the external signal, a progression of the time-continuous oscillation signal through the further delay chain and sampling a count of the further divider, the further decoding means determining a phase difference between the external signal and the time-continuous oscillation signal from the progression and the count.

10. An integrated circuit comprising:

a first and a second input for receiving a first and a second signal, respectively;

a time-continuous oscillator for generating a time-continuous oscillation signal, said time-continuous oscillator including delay chain having an input for receiving a basic signal of said time continuous oscillation signal, said delay chain having a plurality of taps for monitoring a progression of the first signal through the delay chain, one of said taps being retrocoupled to the input of said delay chain for generating the basic signal;

a divider coupled to the input of the delay chain, said divider having an output for providing a count of a number of pulses in the basic signal;

first sampling means having inputs coupled to the taps of the delay chain, and a control input coupled to the second input for receiving the second signal, said first sampling means providing a sample of the progression of the basic signal in response to the second signal;

second sampling means having an input coupled to the output of the divider, and a control input coupled to the second input for receiving the second signal, said second sampling means providing a sample of the count in response to the second signal;

decoding means coupled to said first and said second sampling means for decoding a phase of the divided version of the basic signal in response to the sample of the progression and the sample of the count; and comparator means coupled to said first input and an output of said decoding means for determining a difference between a phase of the first signal and the phase at the output of the decoding means.

* * * * *